(12) United States Patent
Macdonald et al.

(10) Patent No.: US 11,422,178 B2
(45) Date of Patent: Aug. 23, 2022

(54) HAPTICALLY ENHANCED ELECTRICAL INJURY PREVENTION SYSTEMS AND METHODS

(71) Applicant: Proxxi Technology Corporation, Vancouver (CA)

(72) Inventors: Campbell Macdonald, Vancouver (CA); Richard Sim, Vancouver (CA)

(73) Assignee: Proxxi Technology Corporation, Vancouver (CA)

( * ) Notice: Subject to any disclaimer, the term of this patent is extended or adjusted under 35 U.S.C. 154(b) by 84 days.

(21) Appl. No.: 16/825,138

(22) Filed: Mar. 20, 2020

(65) Prior Publication Data

US 2020/0217880 A1    Jul. 9, 2020

Related U.S. Application Data

(63) Continuation-in-part of application No. PCT/CA2018/051059, filed on Aug. 31, 2018.

(60) Provisional application No. 62/553,810, filed on Sep. 2, 2017.

(51) Int. Cl.
| | |
|---|---|
| G01R 29/12 | (2006.01) |
| G06F 1/16 | (2006.01) |
| G06F 3/01 | (2006.01) |
| G07C 5/00 | (2006.01) |
| G08B 21/02 | (2006.01) |

(52) U.S. Cl.
CPC ............. *G01R 29/12* (2013.01); *G06F 1/163* (2013.01); *G06F 3/016* (2013.01); *G07C 5/008* (2013.01); *G08B 21/02* (2013.01)

(58) Field of Classification Search
CPC .. G01R 29/12; G01R 29/0857; G01R 29/085; G01R 29/0814; G06F 1/163; G06F 3/016; G07C 5/008; G08B 21/02; G08B 6/00
See application file for complete search history.

(56) References Cited

U.S. PATENT DOCUMENTS

| | | | |
|---|---|---|---|
| 7,049,972 B2 | 5/2006 | Fabian et al. | |
| 7,171,312 B2 * | 1/2007 | Steinthal | G16H 50/80 |
| | | | 702/32 |
| 7,248,054 B2 | 7/2007 | Kalokitis et al. | |

(Continued)

FOREIGN PATENT DOCUMENTS

| | | |
|---|---|---|
| CN | 105425053 A | 3/2016 |
| CN | 104605530 B | 6/2016 |

(Continued)

OTHER PUBLICATIONS

International Search Report dated Mar. 7, 2019, regarding PCT/CA2018/051059 filed Aug. 31, 2018.

(Continued)

*Primary Examiner* — Fekadeselassie Girma
*Assistant Examiner* — Mancil Littlejohn, Jr.
(74) *Attorney, Agent, or Firm* — AEON Law, PLLC; Adam L. K. Philipp; Jonathan E. Olson

(57) ABSTRACT

Methods and systems are provided in which an electric field above a threshold strength may be detected at one or more wearable articles and in which at least a haptic actuator of the one or more wearable articles is energized in response so as to warn the wearer and thereby effectively prevent electrical injury even if other modes of notification are unavailable.

88 Claims, 10 Drawing Sheets

(56) References Cited

U.S. PATENT DOCUMENTS

| | | |
|---|---|---|
| 7,253,642 B2 | 8/2007 | Kalokitis et al. |
| 7,486,081 B2 | 2/2009 | Kalokitis et al. |
| 8,289,390 B2 | 10/2012 | Aggarwal et al. |
| 8,497,688 B2 | 7/2013 | Dorr et al. |
| 8,523,740 B2 | 9/2013 | Kruse et al. |
| 8,575,942 B2 | 11/2013 | Dorr et al. |
| 8,622,901 B2 | 1/2014 | Jain et al. |
| 8,781,995 B2 | 7/2014 | Stergiou et al. |
| 8,812,943 B2 | 8/2014 | Stergiou et al. |
| 8,822,924 B2 | 9/2014 | Valentino et al. |
| 9,173,567 B2 | 11/2015 | Jain et al. |
| 9,176,819 B2 | 11/2015 | Stergiou et al. |
| 9,423,431 B2 | 8/2016 | Kalokitis |
| 9,429,661 B2 | 8/2016 | Valentino et al. |
| 9,501,930 B2 * | 11/2016 | Smith .................... G01V 3/10 |
| 9,520,044 B2 | 12/2016 | Kalokitis et al. |
| 9,551,761 B2 | 1/2017 | McCollough, Jr. et al. |
| 9,594,183 B2 | 3/2017 | Branson |
| 9,602,956 B1 | 3/2017 | Jin et al. |
| 9,603,090 B2 | 3/2017 | Khan et al. |
| 9,603,123 B1 | 3/2017 | Jackson et al. |
| 9,603,569 B2 | 3/2017 | Mirov et al. |
| 9,606,363 B2 | 3/2017 | Zalewski |
| 9,606,624 B2 | 3/2017 | Cruz-Hernandez et al. |
| 9,607,491 B1 | 3/2017 | Mortimer et al. |
| 9,608,848 B2 | 3/2017 | Roy et al. |
| 9,895,989 B2 | 2/2018 | Czainski |
| 9,912,043 B1 | 3/2018 | Yang |
| 2011/0309941 A1 | 12/2011 | Hyde et al. |
| 2012/0212340 A1 | 8/2012 | Kruse et al. |
| 2015/0077121 A1 | 3/2015 | Branson |
| 2015/0094046 A1 | 4/2015 | Jung et al. |
| 2015/0280424 A1 | 10/2015 | Leimbach et al. |
| 2015/0314083 A1 * | 11/2015 | Blumberg, Jr ........ A61M 5/142 604/500 |
| 2015/0328996 A1 | 11/2015 | Czainski |
| 2016/0207457 A1 | 7/2016 | Border et al. |
| 2017/0119078 A1 | 5/2017 | Chen et al. |
| 2017/0140860 A1 | 5/2017 | Bitetto |
| 2017/0348583 A1 | 12/2017 | Darmour et al. |
| 2018/0164350 A1 * | 6/2018 | Thompson ............... G08B 7/06 |
| 2019/0129406 A1 | 5/2019 | Cella et al. |
| 2019/0146481 A1 | 5/2019 | Cella et al. |
| 2019/0187684 A1 | 6/2019 | Cella et al. |

FOREIGN PATENT DOCUMENTS

| | | | |
|---|---|---|---|
| EP | 3172479 A1 | 5/2017 | |
| WO | 2016/195660 A1 | 12/2016 | |
| WO | WO-2016195660 A1 * | 12/2016 | ............. H02J 7/025 |
| WO | 2017/079389 A1 | 5/2017 | |
| WO | WO-2017079389 A1 * | 5/2017 | ............. A41D 1/002 |
| WO | 2019/041050 A1 | 8/2018 | |

OTHER PUBLICATIONS

Written Opinion dated Mar. 7, 2019, regarding PCT/CA2018/051059 filed Aug. 31, 2018.

Extended European Search Report, European Patent Application No. 18850028.4, dated Mar. 29, 2021, 8 pages.

* cited by examiner

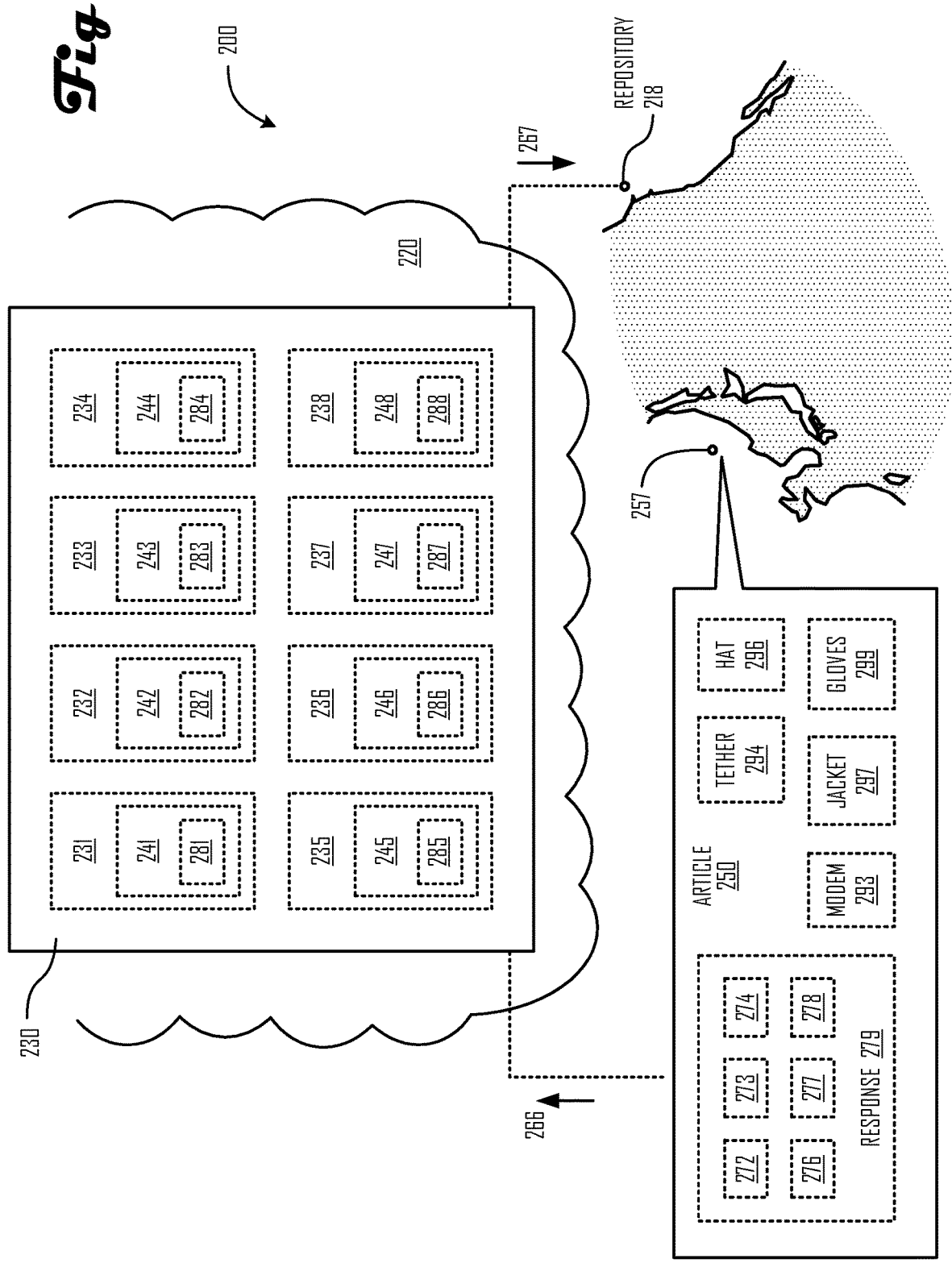

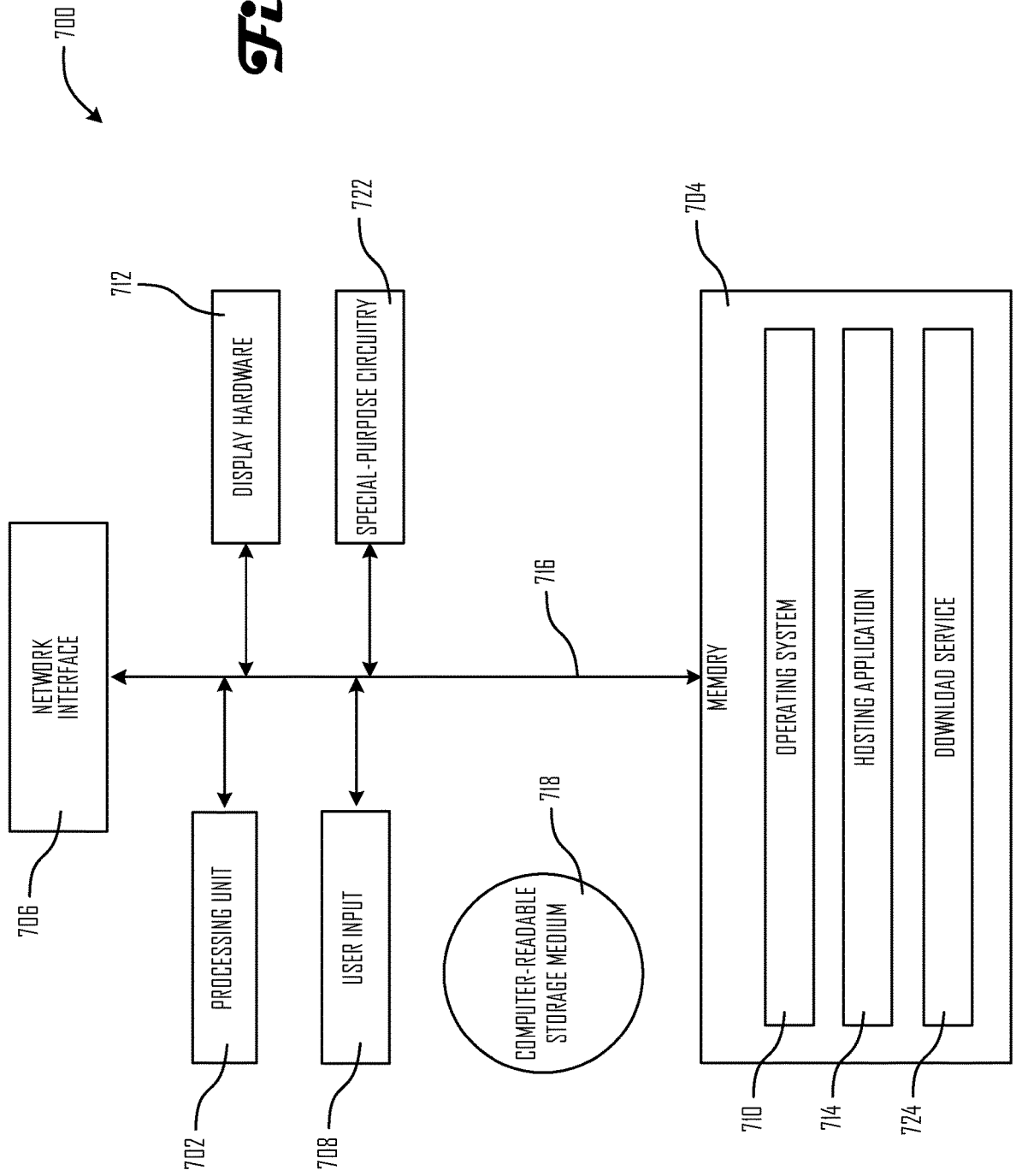

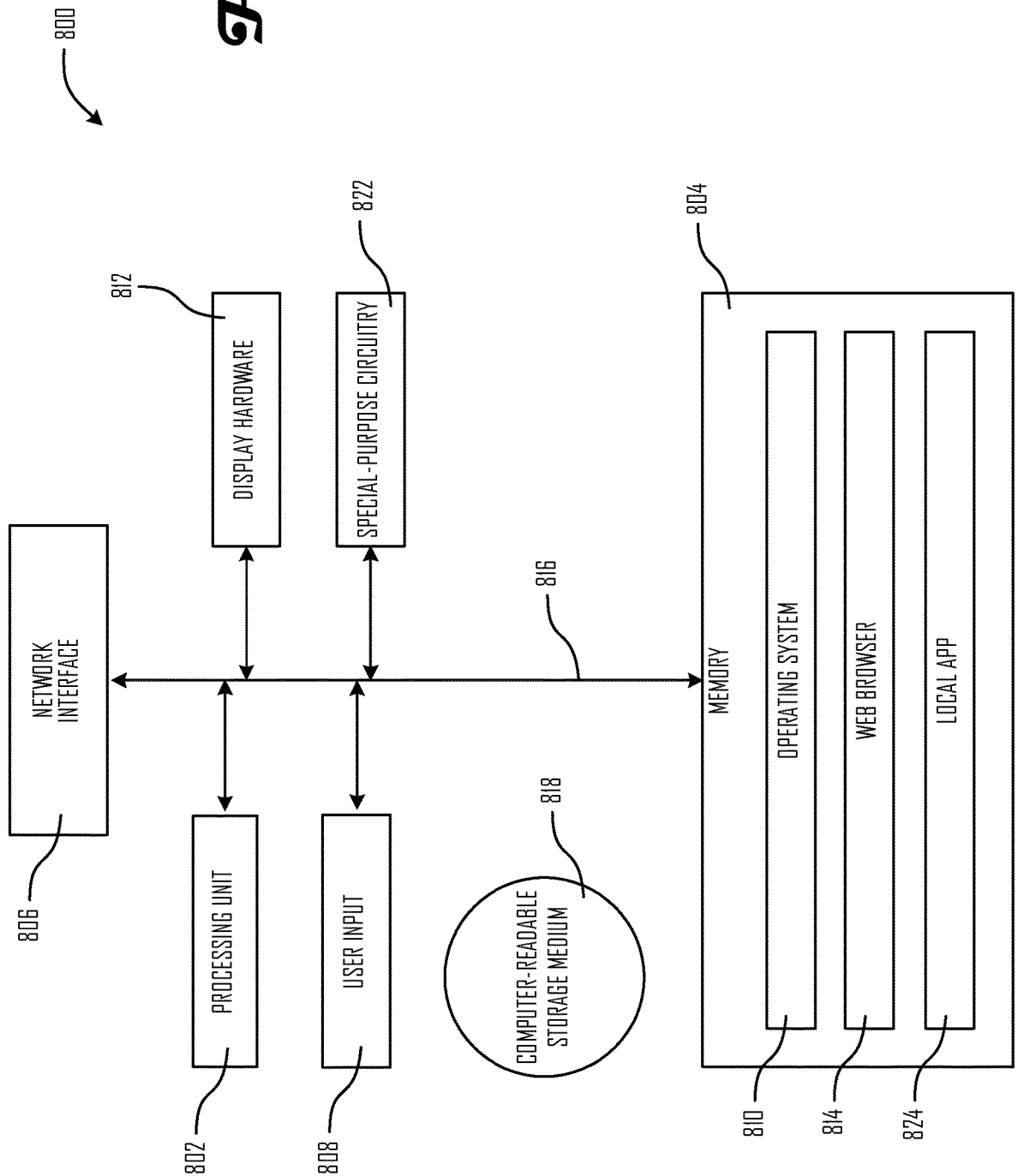

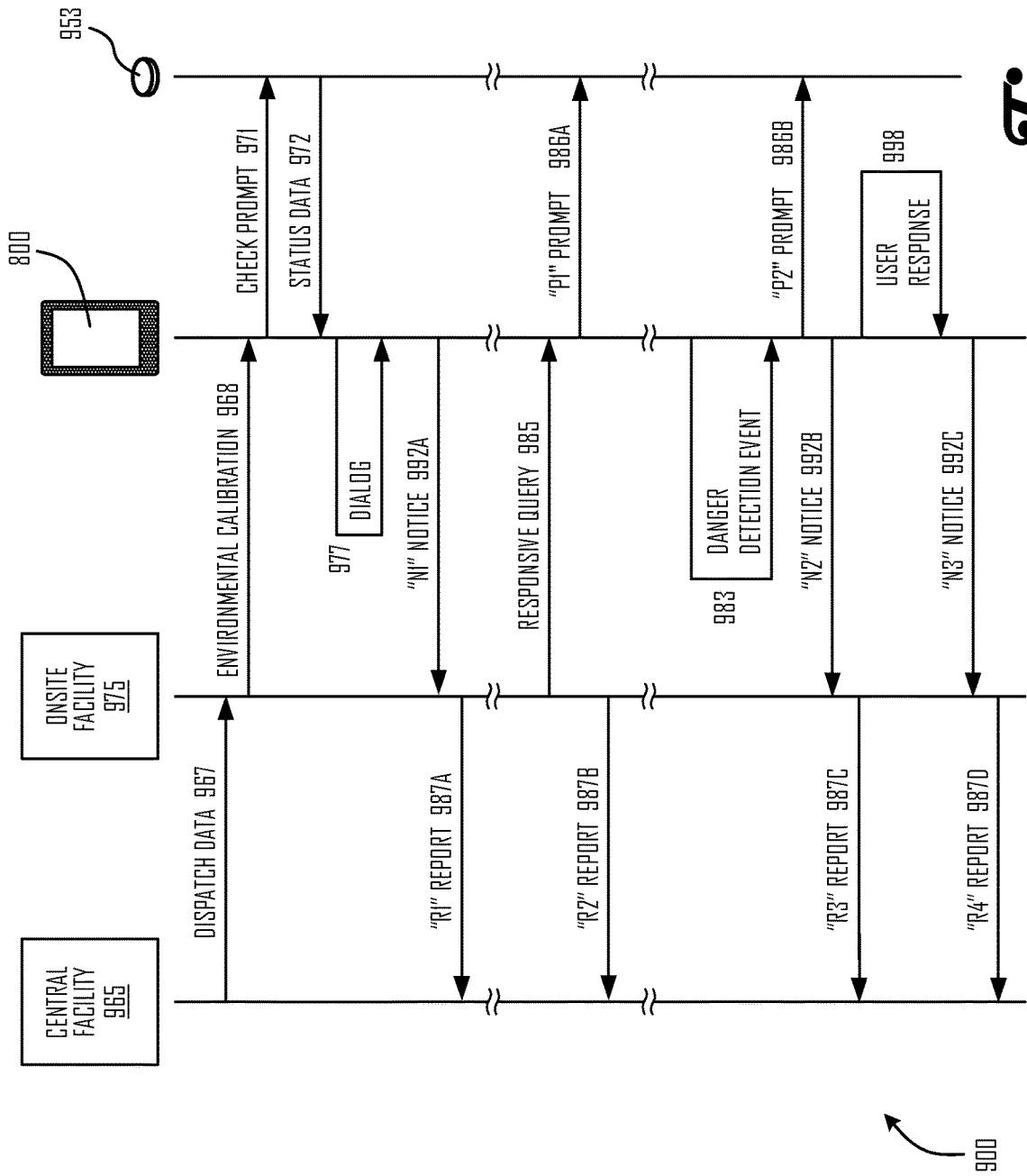

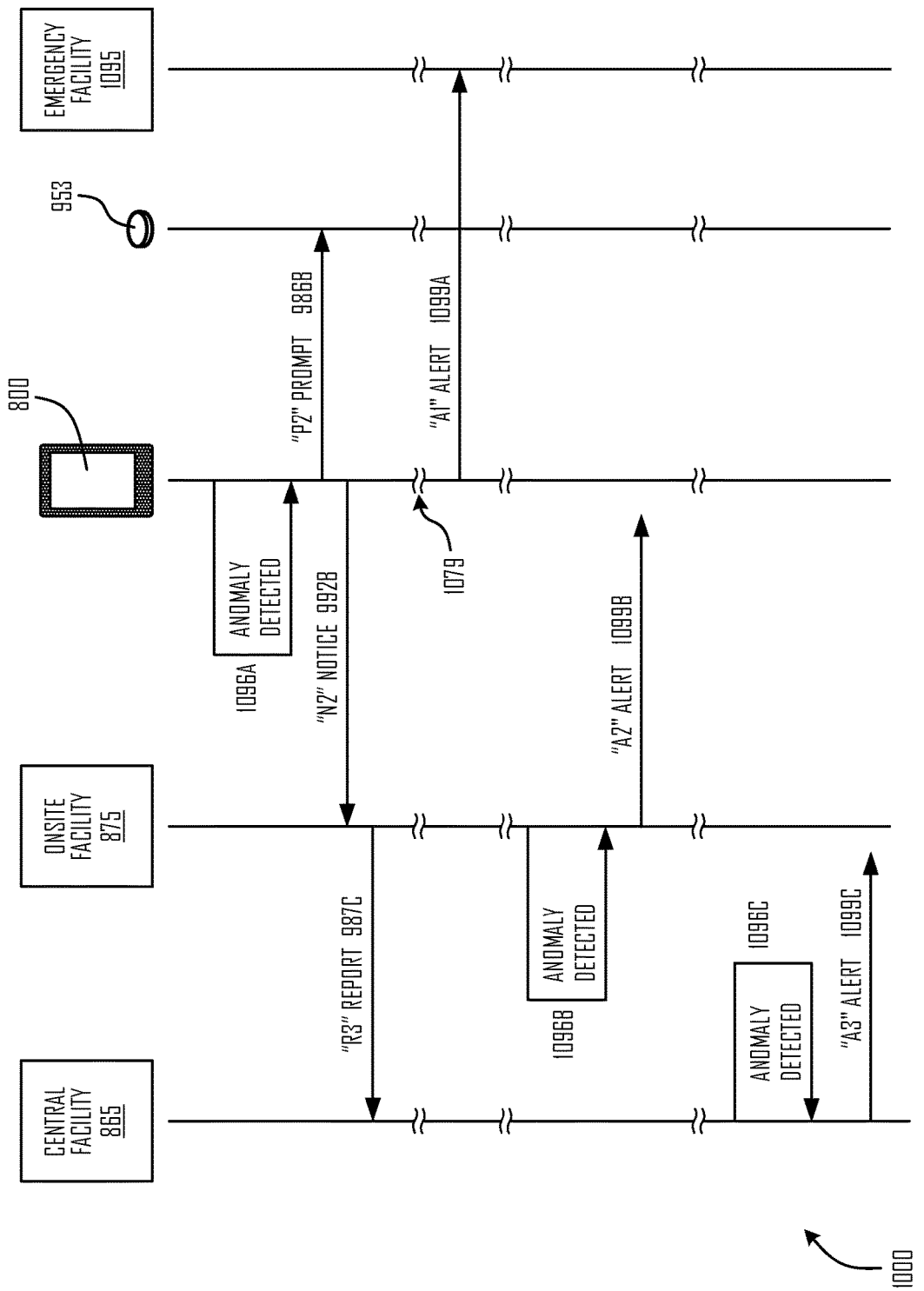

HAPTICALLY ENHANCED ELECTRICAL INJURY PREVENTION SYSTEMS AND METHODS

CROSS-REFERENCE TO RELATED APPLICATIONS

This application claims priority to U.S. Prov. App. No. 62/553,810 ("Haptic electrical injury prevention systems and methods") filed 2 Sep. 2017 and to PCT App. No. PCT/CA2018/051059 ("Haptic electrical injury prevention systems and methods") filed 31 Aug. 2018. Both are incorporated by reference herein to the extent not inconsistent herewith.

BACKGROUND OF THE DISCLOSURE

Each year in North America alone, thousands of people are electrocuted in the workplace due to not knowing that they were about to come too close to electrical equipment that had not been de-energized. While devices like the basic handheld wire and stud detectors are available to consumers—with more professional devices like electroscopic meters for electrical repair workers—the need for consistency in use is still significant and not well addressed.

SUMMARY OF THE FIGURES

FIG. 2 depicts a system in which one or more technologies may be implemented, optionally as an instance of the system of FIG. 1.

FIG. 7 depicts a server in which one or more technologies may be implemented.

FIG. 8 depicts a client device in which one or more technologies may be implemented.

FIG. 9 depicts a data flow in which one or more technologies may be implemented.

FIG. 10 depicts another data flow in which one or more technologies may be implemented.

DESCRIPTION

Figure 1:
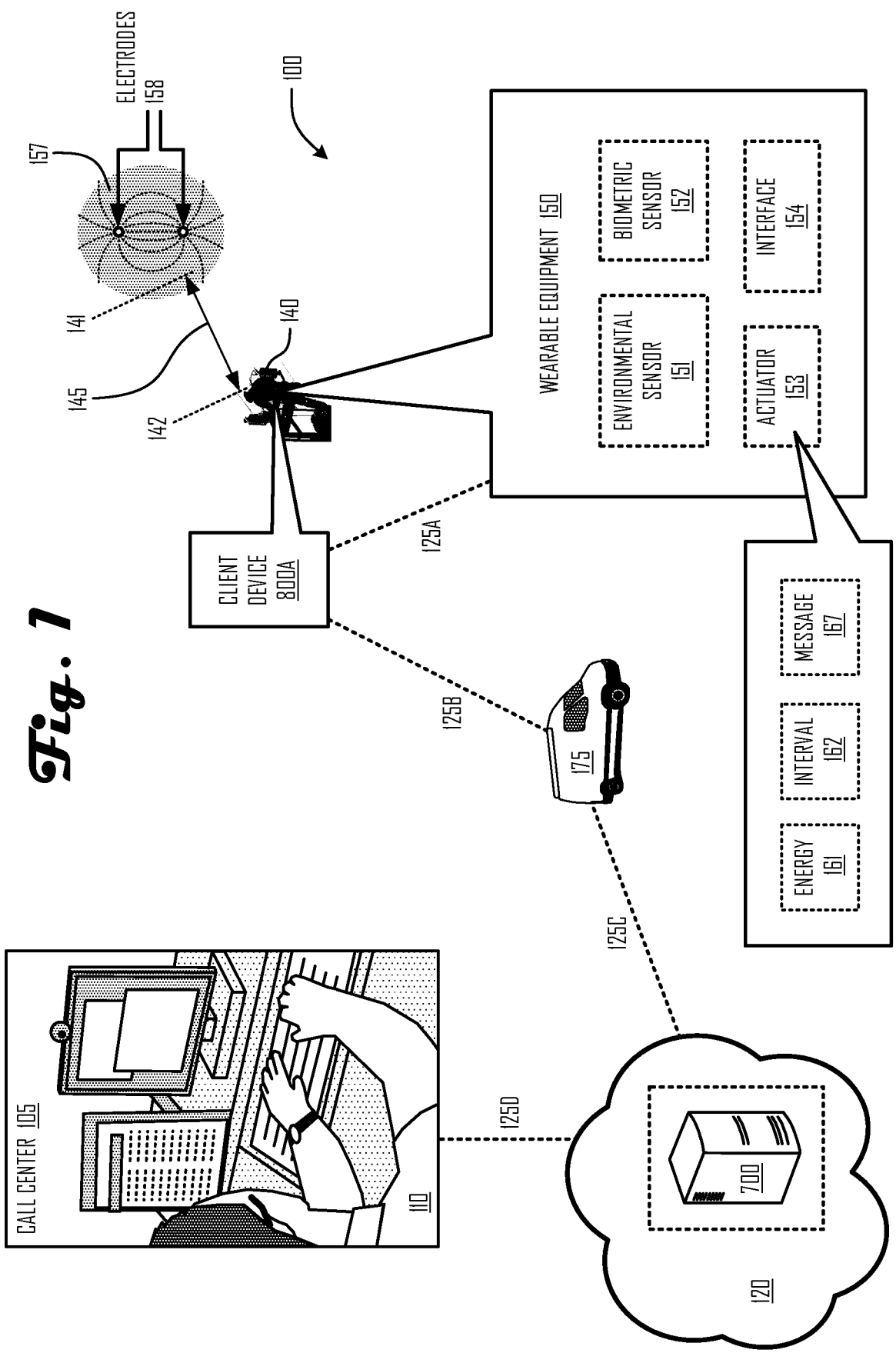
FIG. 1 depicts a system in which one or more technologies may be implemented.

The detailed description that follows is represented largely in terms of processes and symbolic representations of operations by conventional computer components, including a processor, memory storage devices for the processor, connected display devices, and input devices. Furthermore, some of these processes and operations may utilize conventional computer components in a heterogeneous distributed computing environment, including remote file servers, computer servers, and memory storage devices.

The phrases "in one embodiment," "in various embodiments," "in some embodiments," and the like are used repeatedly. Such phrases do not necessarily refer to the same embodiment. The terms "comprising," "having," and "including", are synonymous, unless the context dictates otherwise.

"Adjacent," "again," "associated," "at least," "automatic," "based," "before," "between," "concerning," "conditional," "conductive," "conventional," "digital," "electric," "environmental," "generally," "haptic," "having," "hazardous," "human," "implemented," "informational," "invoked," "likewise," "local," "mechanical," "more," "nominal," "non-hazardous," "on the order of," "opposite," "other," "particular," "peak," "performed," "prescribed," "programmatic," "provided," "responsive," "second," "shown," "some," "structured," "such," "suitable," "time-bound," "transmitted," "triggered," "using," "wearable," "within," or other such descriptors herein are used in their normal yes-or-no sense, not as terms of degree, unless context dictates otherwise. In light of the present disclosure those skilled in the art will understand from context what is meant by "remote" and "real-time" and by other such positional or temporal descriptors used herein. Terms like "processor," "center," "unit," "computer," or other such descriptors herein are used in their normal sense, in reference to an inanimate structure. Such terms do not include any people, irrespective of their location or employment or other association with the thing described, unless context dictates otherwise. As used herein, "on the order" refers to a value within a factor of ten. "For" is not used to articulate a mere intended purpose in phrases like "circuitry for" or "instruction for," moreover, but is used normally, in descriptively identifying special purpose software or structures.

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications, and equivalents. In alternate embodiments, additional devices, or combinations of illustrated devices, may be added to, or combined, without limiting the scope to the embodiments disclosed herein.

FIG. 1 illustrates a system 100 in which one or more technologies may be implemented in the interest of safety for a human subject (wearer 140, e.g.) from an electrical field 157 caused by two or more electrodes 158 producing unsafe voltages of which he is not aware. In particular, a distance margin 145 separates an unsafe part 141 of electrical field 157 from a body part 142 that is safe for the moment but at risk of injury if he moves too much closer notwithstanding conventional protective gear. He also has wearable equipment 150 on, including one or more instances of environmental sensors 151, of biometric sensors 152, of haptic actuators 153, or of auditory or other interfaces 154. Wearable equipment 150 is able to send signals to or receive signals from (via a Bluetooth© or other low energy wireless linkage 125A, e.g.) a client device 800A that is (at least intermittently) in communication with one or more servers 700 of network 120 as described below. As further described below, various levels of haptic pulse energy 161 may be emitted over a prescribed time interval 162 or to deliver one or more haptic or coordinated messages 167 to the wearer 140, such as for entrainment or warning. In some remote project contexts, other communications are made possible by a mobile facility 175 (a motor vehicle that provides a wireless access point, e.g.) and additional linkages 125B, 125C as shown. In appropriate contexts as exemplified below, a reliable linkage 125D may exist at least between server 700 and one or more call centers 105 staffed by emergency response experts or other skilled technicians while wearer 140 is working.

In some variants a first input signal is detected from a first wearable sensor supported by wearer 140 signifying that a first electrical field strength exceeds a first injury prevention threshold 277. In response a first haptic actuator 153 adjacent a particular limb of the wearer is energized as an automatic and conditional real-time response to the first input signal from the first wearable sensor supported by the wearer indicating that the first field strength exceeds the first injury prevention threshold 277, long before any actual danger. As used herein a response is "automatic" if one or more triggers thereof cause the response to occur without subsequent authorization or other conscious intervention.

In another variant the wearer wears a second wearable sensor supported by an opposite limb of the wearer 140 and, in lieu of the first electrical field strength exceeding the injury prevention threshold 277, a second electrical field strength exceeds the injury prevention threshold 277 before such crossing occurs on the first limb. In response the second haptic actuator 153 signaling the opposite limb of the wearer as an automatic and conditional real-time response to the opposite-side input signal from the second wearable sensor indicating that the field strength on that side exceeds the injury prevention threshold 277, the wearer can thus discern immediately which limb is closer to danger.

Pattern recognition circuitry as described herein may comprise an event-sequencing structure generally as described in U.S. Pat. Pub. No. 2015/0094046 but configured as described herein. Such circuitry may include one or more instances of modules configured for local processing, for example, each including an electrical node set upon which informational data is represented digitally as a corresponding voltage configuration. In some variants, moreover, an instance of such modules may be configured for invoking such local processing modules remotely in a distributed implementation. Event detection circuitry as described herein may likewise include one or more instances of modules configured for programmatic response as described below, for example, each including an electrical node set upon which informational data is represented digitally as a corresponding voltage configuration. In some variants, an instance of modules may be configured for invoking such programmatic response modules remotely in a distributed implementation.

Such event sequencing may, in some variants, include a tutorial, startup sequence, entrainment, or other structured interaction including wearable equipment 150, a wearer 140, and perhaps also a mobile client device 800A. In some variants, for example, a mobile facility 175 (e.g., motor vehicle) or other known field source may provide a reference electric field by which a functionality of one or more electric field sensors may be confirmed onsite less than 24 hours before a worker enters a noisy or potentially dangerous worksite. Alternatively, or additionally, in some variants, a haptic or other actuator 153 may provide a suitable calibration, diagnostic, or other referenced field 157 as further described below. As used herein a "structured" interaction may include any timebound and automated sequence of messages among two or more entities (e.g., a device and user thereof) so as to facilitate an enhanced cooperation or trust relationship therebetween.

FIG. 2 illustrates another system 200 in which one or more technologies may be implemented. Transistor-based circuitry 230 (e.g., resident on a data network 220, in one or more wearable articles 250, or a combination thereof) is configured to implement one or more instances of interface modules 231-234, of control modules 235, of response modules 236-237, or invocation modules configured as described below. Digital responses or other informational data thereof may be manifested, for example, as voltage configurations 281-288 thereof on respective electrical node sets 241-248. Alternatively or additionally, such modules 231-238 may reside on a wristband, belt, lanyard, or other tether 294; on a hat 296, helmet, or other headwear; on a jacket 297 or gloves 299; or other such articles 250 worn by a user in a vicinity of a hazard 257. In some variants such articles 250 may communicate informational data 266 (sensor data 272, operating parameters, mathematical protocols, or values distilled therefrom) with a network 220, for example, through a modem 293 or mobile device (e.g., via a wireless local area network or cellular network) as further described herein. In some variants, for example, such informational data 266 may include one or more instances of limits 273, of field strengths 274 or other physical properties, or of quantified or other indications 276, of thresholds 277, of notifications 278, of other responses 279, or of resulting messages 267 as further described below. For example, in some instances, events relating to an electrical injury hazard 257 in Asia (as shown) may relate to messages 267 received in real time at a call center 105 or other repository 218 in North America. As used herein informational data pertaining to an event is received in "real time" if a last portion of the event occurred less than one minute prior to the receipt. "Real time" as used herein means within less than one minute, unless context dictates otherwise.

In some variants a portable actuator 153 that is part of a wearable article 250 is wired thereon to a wireless modem 293 or to one or more modules 231-238 aboard the wearable article 250 (or both). As used herein a conductor is "wired to" another if a primary signal path between them is mechanically coupled to both, whether or not that signal path is a monolithic conduit and irrespective of which directions signals flow along that path. In some variants, circuitry in respective wearable articles 250 are wired together and in others they may rely on a Bluetooth or other suitable wireless interconnection therebetween. As used herein, an electrical component is "energized" by passing a current through it or placing a voltage across it so as to cause it to perform a function in accordance with its design.

Figure 3:
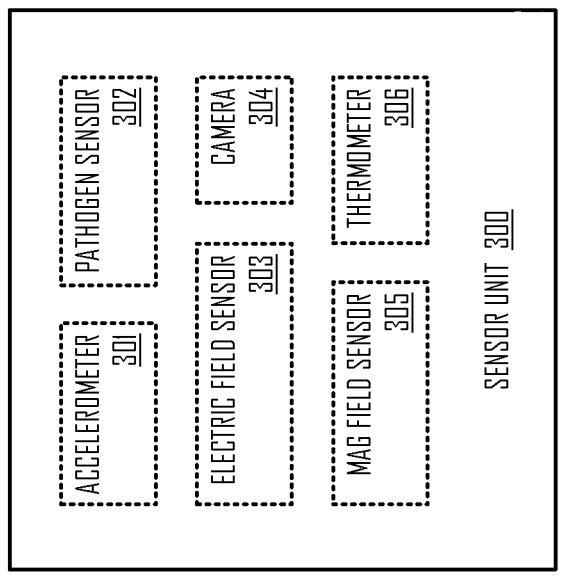
FIG. 3 depicts a sensor unit in which one or more technologies may be implemented.

FIG. 3 depicts a sensor unit 300 in which one or more technologies may be implemented (within a client device 800A or wearable equipment 150, e.g.). Sensor unit 300 as shown may include one or more instances of accelerometers 301, of pathogen sensors 302 (configured to detect carbon monoxide or other dangerous gases, e.g.), of electrical field sensors 303, of cameras 304, of electromagnetic or other magnetic field sensors 305, of thermometers 306, or of other event detection circuitry (comparators, e.g.) by which dangerous conditions may be detected.

Figure 4:
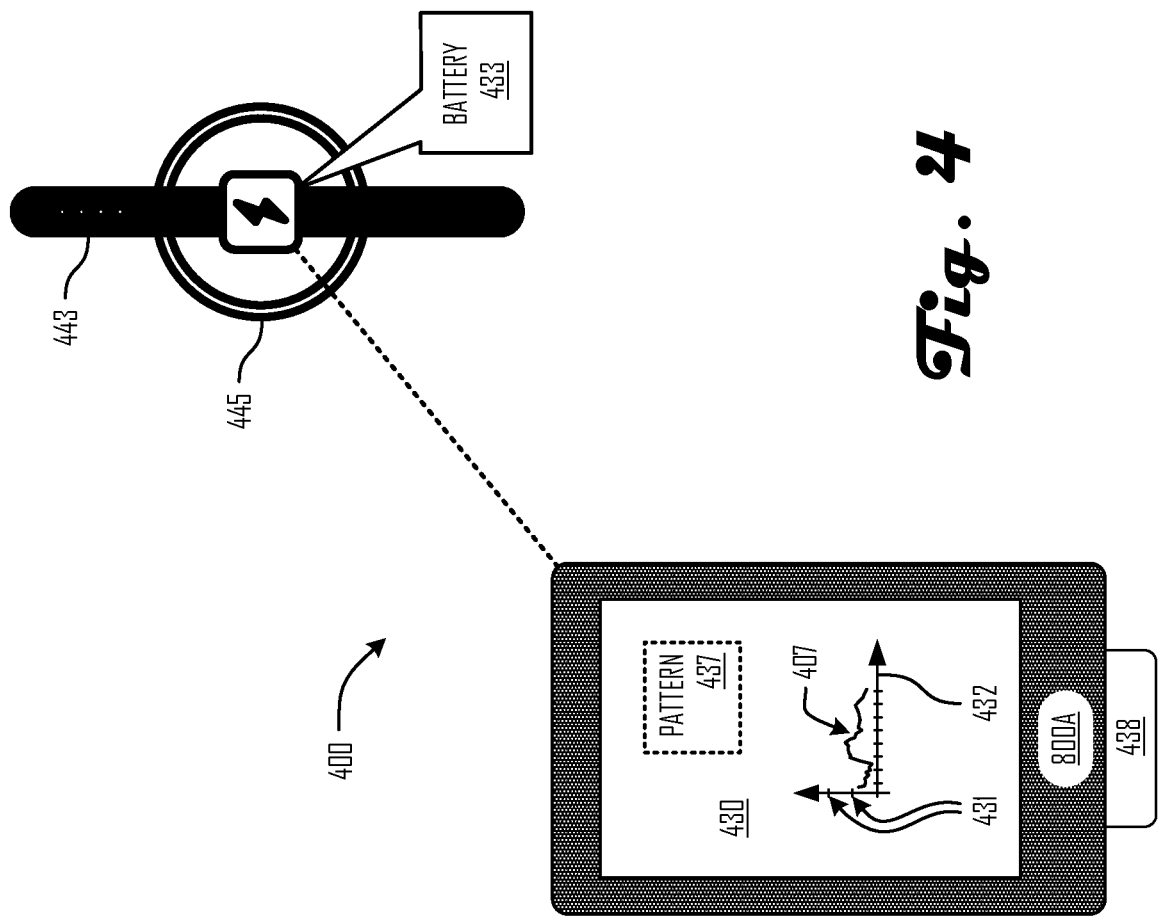
FIG. 4 depicts a system in which one or more technologies may be implemented, optionally as an instance of the system of FIG. 1 or 2.

FIG. 4 illustrates another system 400 in which one or more technologies may be implemented, one in which a signal output from a sensor unit 300 (implemented in a client device 800A, e.g.) is compared against one or more patterns 437. Such outputs may also be tracked and presented (via an image 430 on client device 800A, e.g.) in relation to various threshold 277, 431 described herein, showing a succession of values in relation to a logarithmic time scale 432 having regular markings leftward from the last value at factor-of-ten intervals 162 (such that the rightmost markings are from 1 second ago, 2 seconds ago, 5 seconds ago, 10 seconds ago, etc.).

In the interest of concision and according to standard usage in information management technologies, the functional attributes of modules described herein are set forth in natural language expressions. It will be understood by those skilled in the art that such expressions (functions or acts recited in English, e.g.) adequately describe structures identified below so that no undue experimentation will be required for their implementation. For example, any signal values 407, patterns 437 (e.g. thresholds 277), or other informational data 266 identified herein may easily be represented digitally as a voltage configuration on an electrical node set (conductive pads of an integrated circuit, e.g.) of an event-sequencing structure without any undue experimentation. Each electrical node is highly conductive, having a corresponding (nominal) voltage level that is spatially uniform generally throughout the node (within a device or local system as described herein, e.g.) at relevant times (at clock transitions, e.g.). Such nodes (lines on an integrated circuit or circuit board, e.g.) may each comprise a forked or other signal path adjacent one or more transistors. Moreover, many Boolean values (yes-or-no decisions, e.g.) may each be manifested as either a "low" or "high" voltage, for example, according to a complementary metal-oxide-semiconductor (CMOS), emitter-coupled logic (ECL), or other common semiconductor configuration protocol. In some contexts, for example, one skilled in the art will recognize an "electrical node set" as used herein in reference to one or more electrically conductive nodes upon which a voltage configuration (of one voltage at each node, for example, with each voltage characterized as either high or low) manifests a yes/no decision or other digital data. In some variants such a client device 800A may be paired wirelessly with wearable, rechargeable equipment 150 such as a wristband 443 powered by a battery 433 recharged in a cradle 445 as shown. Alternatively, or additionally, a client device 800A may interface with a camera 304 or other sensors on a helmet, gloves, boots, or other wearable equipment 150 having a haptic actuator 153 and a suitable power supply.

Figure 5:
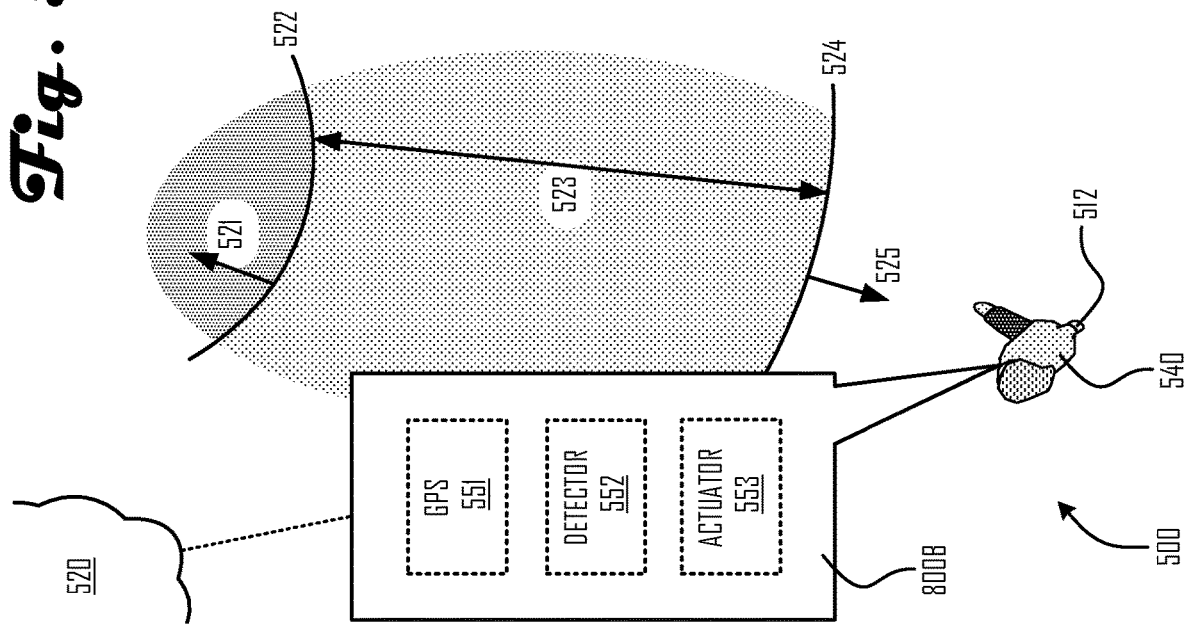
FIG. 5 depicts another system or device in which one or more technologies may be implemented.

FIG. 5 depicts another local client device 800B or system 500 in which one or more technologies may be implemented. Client device 800B includes one or more instances of global positioning systems, of detectors 552 (including a sensor unit 300 and one or more modules for recognizing thresholds or other patterns 437 of measured values, and of haptic actuators adjacent limbs 512 or other respective body parts of wearer 540. To ensure that an alert is provided via haptic actuator 553 before wearer 540 reaches a boundary 522 of an electrical danger zone 521, one or more buffer zones 523 are each defined as a space between two equipotential zone boundaries 522, 524. Forming zone boundaries at least partly across equipotential surfaces minimizes real-time computations and allows for a prompt and appropriate alert (via actuator 553, e.g.) whenever detector 552 reaches a strong-enough field (one stronger than a threshold 277 set by user 110, e.g.) without first waiting for access to a data network 520.

Figure 6:
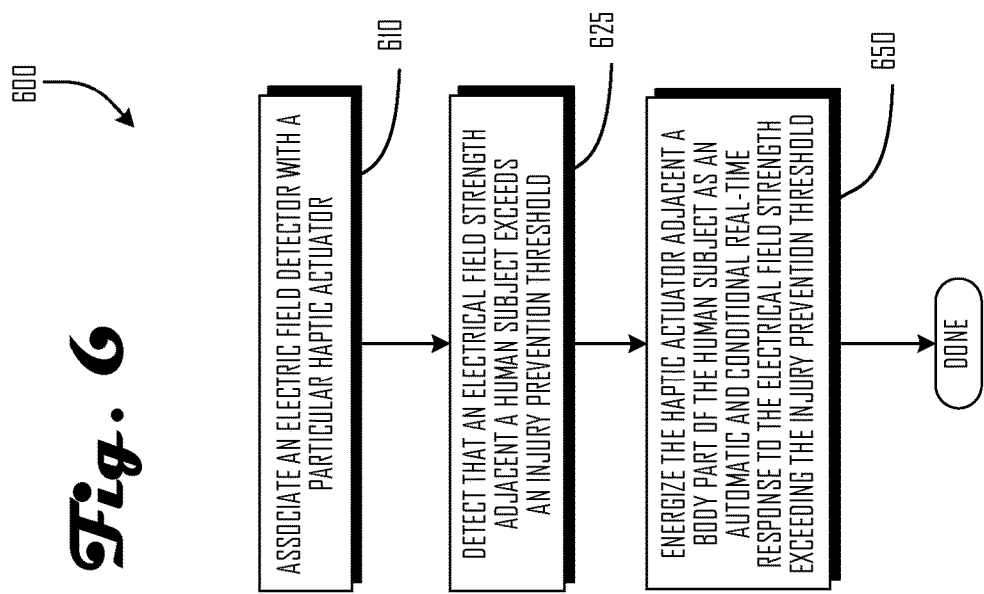
FIG. 6 depicts an operational flow in which one or more technologies may be implemented.

FIG. 6 illustrates an operational flow 600 in which one or more technologies may be implemented (within or in conjunction with one or more wearable or other portable client devices 800A, e.g.). At operation 610, an electric field detector is associated with a particular haptic actuator (by wirelessly pairing device 800A with a band 443 configured to hold a haptic actuator 453 adjacent a wearer, e.g.). At operation 625, an electrical field strength adjacent a human subject is determined to exceed an injury prevention threshold 277 (by detecting boundary 524 with a suitable field strength threshold 277 on the order of 10 volts per meter as a peak magnitude provided by user 110, e.g.).

At operation 650, the haptic actuator is energized adjacent a body part of the human subject as an automatic and conditional real-time response to the electrical field strength exceeding the injury prevention threshold 277 (by energizing actuator 453 in real time without waiting for a GPS determination, e.g.).

FIG. 7 illustrates several components of an exemplary server 700. In some embodiments, server 700 may include many more components than those shown in FIG. 7. However, it is not necessary that all of these generally conventional components be shown in order to disclose an illustrative embodiment. As shown in FIG. 7, server 700 includes a data network interface 706 for connecting via a data network 120, 520.

Server 700 may also include one or more instances of processing unit 702, a memory 704, display hardware 712, all interconnected along with the network interface 706 via a bus 716. Memory 704 generally comprises a random access memory ("RAM"), a read-only memory ("ROM"), and a permanent mass storage device, such as a disk drive.

Memory 704 may likewise contain an operating system 710, hosting application 714, and download service 724 (for downloading apps, e.g.). These and other software components may be loaded from a non-transitory computer readable storage medium 718 into memory 704 of the server 700 using a drive mechanism (not shown) associated with a non-transitory computer-readable storage medium 718, such as a floppy disc, tape, DVD/CD-ROM drive, flash card, memory card, or the like. In some embodiments, software components may also be loaded via the network interface 706, rather than via a computer-readable storage medium 718. Special-purpose circuitry 722 may, in some variants, include some or all of the event-sequencing logic described herein.

FIG. 8 illustrates several components of an exemplary client device 800. In some embodiments, client device 800 may include many more components than those shown in FIG. 8. However, it is not necessary that all of these generally conventional components be shown in order to disclose an illustrative embodiment. As shown in FIG. 8, client device 800 includes a data network interface 806 for connecting via a data network 120, 520.

Client device 800 may also include one or more instances of processing unit 802, a memory 804, user input 808, display hardware 812, all interconnected along with the network interface 806 via a bus 816. Memory 804 generally comprises a random access memory ("RAM"), a read-only memory ("ROM"), and a permanent mass storage device, such as a disk drive.

Memory 804 may likewise contain an operating system 810, web browser 814, and local app 824 (obtained via download service 724, e.g.). These and other software components may be loaded from a non-transitory computer-readable storage medium 818 into memory 804 of the client device 800 using a drive mechanism (not shown) associated with a non-transitory computer readable storage medium 818, such as a floppy disc, tape, DVD/CD-ROM drive, flash card, memory card, or the like. In some embodiments, software components may also be loaded via the network interface 806, rather than via a computer-readable storage medium 818. Special-purpose circuitry 822 may, in some variants, include some or all of the event-sequencing logic described herein.

FIG. 9 illustrates a data flow 900 with an exemplary series of events (communications or other processes, e.g.) suitable for use with at least one embodiment. In some variants of the above-described methods, for example, dispatch data 967 (describing a work task, e.g.) is provided from a central facility 965 (having a server 600 and call center 105 as described above, e.g.) to a mobile facility 175 or other onsite facility 975 that relays a portion thereof (an environmental calibration 968. In some contexts, current local measurements (of humidity or temperature with a timestamp, e.g.) are then fed back to central facility 965 for aggregation. A locally resident app 724 or special-purpose circuitry 722 of client device 800A is invoked (in response to user data entry, e.g.), triggering a check prompt 971 that energizes haptic actuator. The occurrence of that actuation is confirmed with (user provided or other) status data 972, confirming a charge level of a battery that powers haptic actuator 953. Client device 800 provides a structured dialog 977 with a wearer 140, 540 soon after the login (so that a less-experienced operator will receive appropriately explicit guidance, e.g.). A notice 992A is transmitted from the client device 800 (in an immediate vicinity of the wearer, e.g.) initially to signify a completion of the structured dialog 977. Alternatively or additionally one or more such notices 992A may be provided periodically (with intervals 162 on the order of a minute or of an hour, e.g.) providing a timestamp and measurement data (signifying a volts-per-meter reading, precise location coordinates, photographic images, or other such field data provided by event detection circuitry 438, e.g.). Alternatively, or additionally, onsite facility 975 may aggregate, filter, and pass on such data (a sampling or other distillation of heartbeat data, e.g.) as report 987A to central facility 965.

As used herein, a structured dialog 977 or other "structured" interaction signifies more than a mere user input or device output in isolation. Rather, it may include one or more instances of semi-automatic protocols, online quizzes, entrainments, user-assisted diagnostics, prompted calibrations, tutorials, or other such contemporaneous event sequences by which a human and machine expressively help each other via one or more user interfaces of the machine. Some such protocols, for example, may include a pulse sequence or other haptic actuation before or during a notification to a user that mentions the actuation or otherwise states that the actuator is currently energized or imminently to be energized. Such multimodal notification, coupled with a user-initiated trigger (e.g., a powerup) less than 5 minutes prior, exemplifies a "structured dialog" as used herein. As used herein an interactive event sequence is "contemporaneous" if it does not include any communication gaps longer than five minutes between successive component communications thereof.

In some variants of the above-described methods, onsite facility 975 generates a responsive query 985 in response to an anomaly detected in one or more notices 992A (signaling a missing periodic instance of notice 992A, e.g.). This can occur, for example, in a context in which client device 800 is disabled (destroyed, e.g.) or out of range and in which a distinctive prompt 986A (distinguishable from check prompt 971 by a wearer, e.g.) lets the wearer know that a responsive query 985 has been received from onsite facility 975 (signaling that an expected notice 992A was not received, e.g.). Alternatively, or additionally, (special-purpose circuitry 722 aboard) onsite facility 975 may be configured in such contexts to transmit a specific report 987B (signaling a missing periodic instance of notice 992A to central facility 965+, e.g.).

In some variants of the above-described methods, an anomalous pattern of values triggers onsite facility 975 to generate a responsive query 985 (a robocall or app activation, e.g.). This can occur, for example, in a context in which one or more expected periodic instances of notice 992A are not received, for example. Other device-detectable patterns 337 of significance are also contemplated, such as client device 800A reporting its location as stationary for an extended period. Alternatively, or additionally, such occurrences may trigger a pronounced haptic prompt 986A (longer than that of check prompt 971, e.g.).

In some variants of the above-described methods, a danger detection event 983 (manifested as an anomalous output from event detection circuitry 438, e.g.) triggers client device 800A to generate another distinct haptic prompt 986B signaling danger. This can occur, for example, in a context in which an extreme measurement is received from accelerometer 301, pathogen sensor 302, electric field sensor 303, magnetic field sensor 305, or thermometer 306. Other device-detectable patterns 337 of significance are also contemplated, such as an exclamation (such as one that sounds like "Help!") or a camera 304 (mounted on a helmet or other clothing-external item, e.g.) showing all black for an extended period. Alternatively, or additionally, such occurrences may trigger a notice 992B of the pattern to onsite facility 975 that may then be relayed (as report 987C with location data, e.g.).

If a user response 998 to the prompt 986B is later received (signaling a false alarm or other non-emergency message, e.g.), some or all of the response is promptly relayed as a notice 992C to an onsite facility 975 and as a report 987D to a central facility 965.

FIG. 10 illustrates a data flow 1000 as an optional continuation of that of FIG. 9 suitable for use with at least one embodiment. In some contexts, a pattern signaling an anomaly detected 1096A at client device 800 may trigger another instance of haptic prompt 986B and of notice 992B of the pattern to onsite facility 975 that may then be relayed (as report 987C with location data, e.g.). After a more significant delay 1079 (on the order of 5 or 10 minutes, e.g.) an intelligent alert 1099A is automatically sent (providing the details giving rise to the alert to an emergency facility 1095 or other designated entity/person, e.g.). This can occur in the instance of a serious fall or electrical shock, for example, in which case a shorter delay may be warranted (supported by large-enough measurement from an accelerometer 301 or electrical field sensor 303, e.g.).

In some variants of the above-described methods, an anomaly detected 1096B at onsite facility 975 may trigger another instance of a haptic prompt 986B or other appropriate alert 1099B to be sent (with supporting data provided via client device 800, e.g.). Likewise, an anomaly detected 1096C at onsite facility 965 (detected by advanced protocols there that have not yet been locally automated, e.g.) may trigger another instance of an appropriate alert 1099C (to client device 800 or emergency facility 1095, e.g.) with supporting data.

In light of teachings herein, numerous existing techniques may be applied for configuring special-purpose circuitry or other structures effective for pattern recognition or other tasks as described herein without undue experimentation. See, e.g., U.S. Pat. No. 9,895,989 ("Safety system, a method of operating a safety system and a method of building a safety system"); U.S. Pat. No. 9,608,848 ("Communicating through physical vibration"); U.S. Pat. No. 9,607,491 ("Apparatus for generating a vibrational stimulus using a planar reciprocating actuator"); U.S. Pat. No. 9,606,624 ("Systems and methods for surface elements that provide electrostatic haptic effects"); U.S. Pat. No. 9,606,363 ("Head mounted device (HMD) system having interface with mobile computing device for rendering virtual reality content"); U.S. Pat. No. 9,603,569 ("Positioning a wearable device for data collection"); U.S. Pat. No. 9,603,123 ("Sending smart alerts on a device at opportune moments using sensors"); U.S. Pat. No. 9,603,090 ("Management of near field communications using low power modes of an electronic device"); U.S. Pat. No. 9,602,956 ("System and method for device positioning with Bluetooth"); U.S. Pat. No. 9,594,183 ("Method for buried service detection using a mains socket"); U.S. Pat. No. 9,551,761 ("Portable magnetic, electric and radio frequency field monitoring apparatus and method"); U.S. Pat. No. 9,520,044 ("Apparatus and method for monitoring and controlling detection of stray voltage anomalies"); U.S. Pat. No. 9,429,661 ("Wireless, motion and position-sensing, integrating radiation sensor for occupational and environmental dosimetry"); U.S. Pat. No. 9,423,431 ("Method and apparatus for discrimination of sources in stray voltage detection"); U.S. Pat. No. 9,176,819 ("Detecting sensor malfunctions using compression analysis of binary decision diagrams"); U.S. Pat. No. 9,173,567 ("Triggering user queries based on sensor inputs"); U.S. Pat. No. 8,822,924 ("Wireless, motion and position-sensing, integrating radiation occupational and environmental dosimetry"); U.S. Pat. No. 8,812,943 ("Detecting data corruption in medical binary decision diagrams using hashing techniques"); U.S. Pat. No. 8,781,995 ("Range queries in binary decision diagrams"); U.S. Pat. No. 8,622,901 ("Continuous monitoring of stress using accelerometer data"); U.S. Pat. No. 8,575,942 ("Non-contacting method and apparatus for determining contact voltage sources and providing a warning for same"); U.S. Pat. No. 8,523,740 ("Method and apparatus for providing communications with haptic cues"); U.S. Pat. No. 8,497,688 ("Non-contact arc detection apparatus and method"); U.S. Pat. No. 8,289,390 ("Method and apparatus for total situational awareness and monitoring"); U.S. Pat. No. 7,049,972 ("Lightning strike hazard detector"); U.S. Pat. No. 7,486,081 ("Apparatus and method for monitoring and controlling detection of stray voltage anomalies"); U.S. Pat. No. 7,253,642 ("Method for sensing an electric field"); U.S. Pat. No. 7,248,054 ("Apparatus and method for detecting an electric field"); U.S. Pat. Pub. No. 20190187684 ("Methods and systems for data collection in mining environment with haptic feedback and continuously monitored alarm"); U.S. Pat. Pub. No. 20190146481 ("Systems and methods for data collection providing a haptic user interface"); U.S. Pat. Pub. No. 20190129406 ("Systems and methods of data collection monitoring utilizing a peak detection circuit"); U.S. Pat. Pub. No. 20170348583 ("Wearable technology for enhancing kinesthetic performance"); and U.S. Pat. Pub. No. 20160207457 ("System for assisted operator safety using an HMD"). These documents are incorporated herein by reference to the extent not inconsistent herewith.

Figure 11:
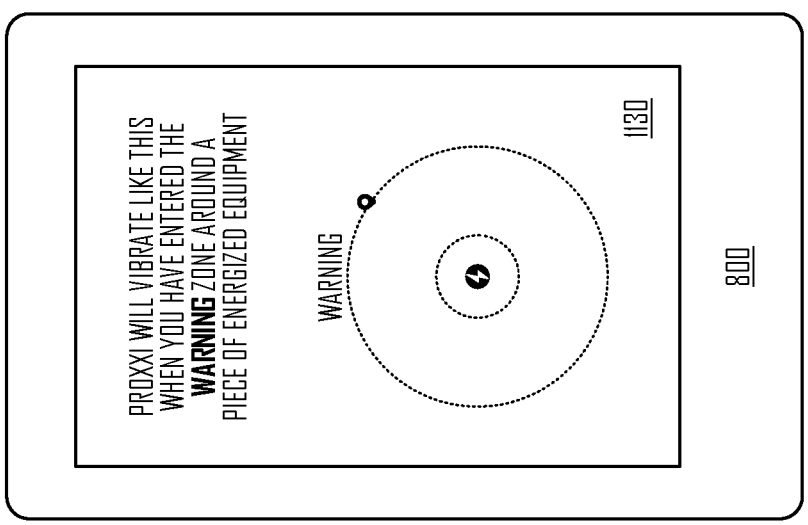
FIG. 11 depicts a client device in which one or more technologies may be implemented, featuring a first warning.

FIG. 11 illustrates a screen display image 1130 presented via a client device 800 as a component of a structured dialog 977 suitable for everyday use (in response to a wearer of equipment that includes a haptic actuator 453, 953 logging into server 700, e.g.).

Figure 12:
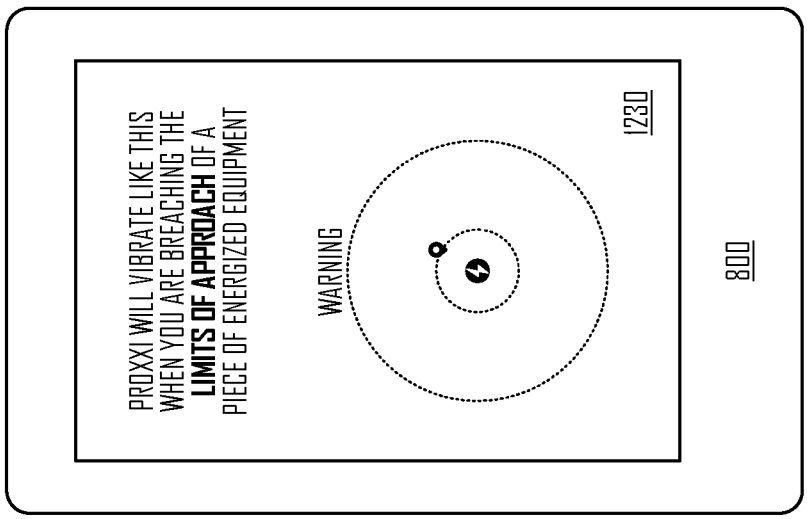
FIG. 12 depicts a client device in which one or more technologies may be implemented, featuring a second warning.

FIG. 12 illustrates a screen display image 1230 presented via a client device 800 as a component of a structured dialog 977 suitable for initial training purposes (in response to a wearer of equipment that includes a haptic actuator 453, 953 creating an account on server 700, e.g.).

Figure 13:
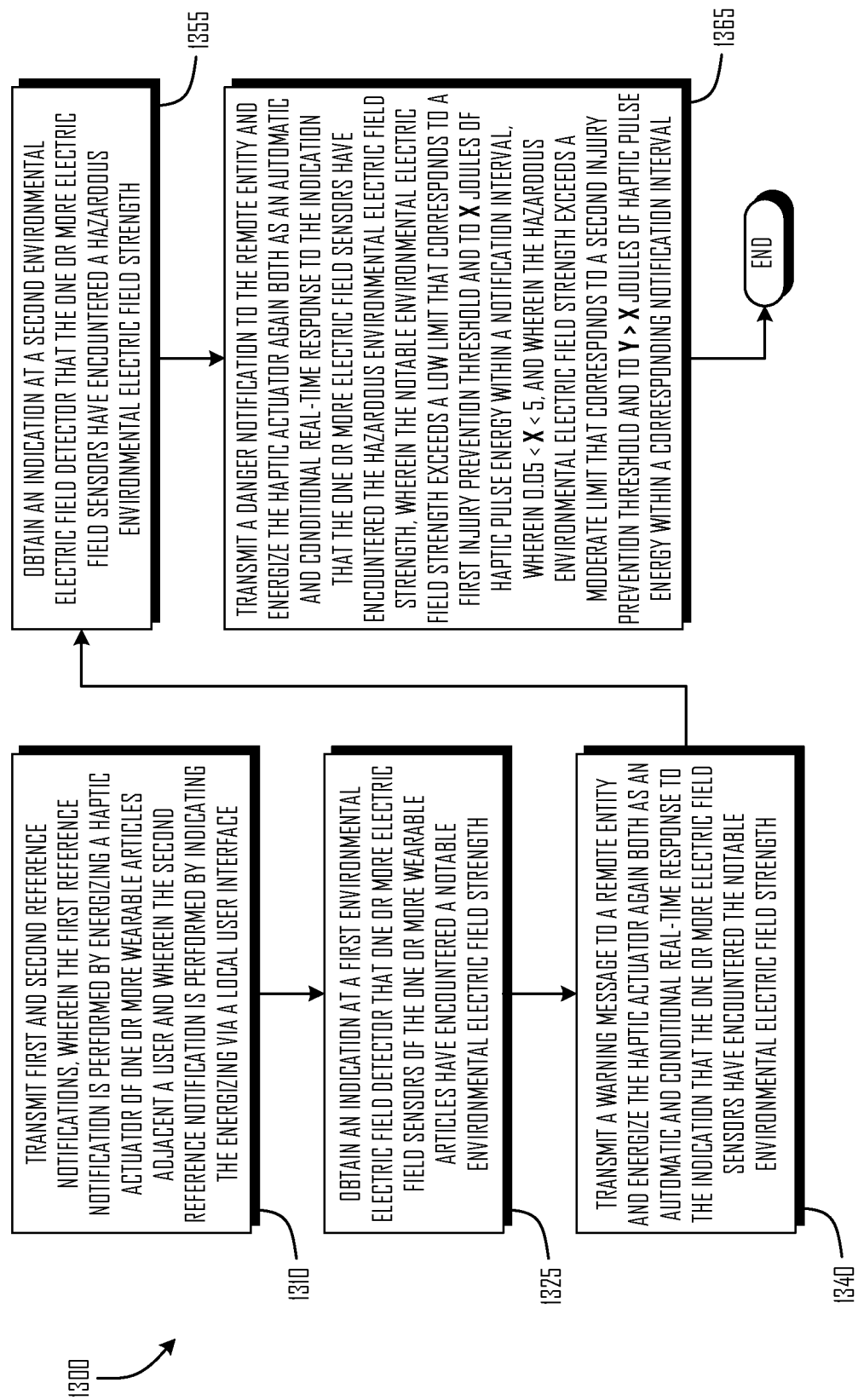
FIG. 13 depicts an operational flow in which one or more technologies may be implemented.

FIG. 13 illustrates an operational flow 1300 in which one or more technologies may be incorporated. Operation 1310 describes transmitting first and second reference notifications, wherein the first reference notification is performed by energizing a haptic actuator of one or more wearable articles adjacent a user and wherein the second reference notification is performed by indicating the energizing via a local user interface (e.g., one or more interface modules 232 transmitting diagnostic, startup, or other entrainment notifications 278 as automatic and conditional constituent responses 279 to one or more indications 276 that a calibrated artificial electric field strength 274 at a first electric field sensor 303 adjacent a wearer 140 exceeds a first activation threshold 277). This can occur, for example, in a context in which the first (instance of a) reference notification 278 is performed by energizing (an instance of) a haptic actuator 153, 953 of one or more wearable articles 250, in which the second reference notification 278 is performed by asking about our otherwise referring to the haptic actuator(s) 153 via a (speaker, display hardware 812, or other) local user interface 154, and in which the notifications 278 are each manifested as a voltage configuration 282 on an electrical node set 242 on or operably coupled with the one or more wearable articles 250. As used herein a user interface is "local" if it is on or otherwise within a visual, audible, or tactile proximity of a wearer 140 of one or more wearable articles 250 (e.g. in a line of sight or human hearing range thereof) as described herein.

Operation 1325 describes obtaining an indication at a first environmental field detector that one or more electric field sensors of the one or more wearable articles have encountered a notable environmental field strength (e.g., one or more interface modules 233 receiving or generating a digital indication 276 that at least the first electric field sensor 303 of the one or more wearable articles 250 adjacent a wearer 140, 540 have encountered a mild or moderate environmental field strength 274). This can occur, for example, in a context in which the one or more electric field sensors 303 include the "first" electric field sensor, in which the digital indication 276 is (a scalar or other value) directly or inversely correlated with the field strength 274 and is calibrated for a comparison with one or more user-configured thresholds 277 so as to generate a Boolean (instance of an) indication whether or not a detected field strength 274 exceeds a corresponding effective limit 273, in which the effective limit 273 is on the order of (i.e., within a factor of ten of) 0.5 to 5 volts per meter, and in which one or more such Boolean indications are manifested as a voltage configuration 283 on an electrical node set 243. In some variants, for example, such an indication may be a hybrid determinant (e.g., such that it can be triggered by an estimated proximity to a high voltage hazard or other criterion) indicative of a heightened risk of injury. Alternatively, or additionally, in some variants a series of several limits 273 or other criteria may (optionally) be implemented such that a threshold 277 implements an intermediate-risk effective field strength limit 273 that is within an order of magnitude of 50 to 500 volts per meter.

Operation 1340 describes transmitting a warning message to a remote entity and energizing the haptic actuator again both as an automatic and conditional real-time response to the indication that the one or more electric field sensors have encountered the notable environmental field strength (e.g., one or more response modules 236 contemporaneously or otherwise transmitting first and second instances of warning notifications 278 each as a conditional constituent real-time response 279 to the first electric field sensor 303 being exposed to the first environmental field strength 274, wherein the first warning notification is performed by energizing the first haptic actuator 153, 953 again and wherein the second warning notification is performed by transmitting a digital warning message 267 to a remote data repository 218). This can occur, for example, in a context in which the first environmental field strength 274 is strong enough to cause one or more user-defined thresholds 277 to be crossed (e.g., effectively determining a boundary between a weak electric field and a moderate or negligible electric field), in which such notifications constitute a real-time (direct or other) response 279 to the first electric field sensor 303 detecting the first environmental field strength 274, in which the weakest field strength 274 that would trigger such notifications 278 is within 2-3 orders of magnitude of 50 volts per meter, in which at least one such notification 278 implements a "first" injury prevention threshold 277 manifested as a voltage configuration 286 on an electrical node set 246 of the response module(s) 236, and in which this instance of energizing the haptic actuator(s) features a total delivery of haptic pulse energy 161 delivered via the first haptic actuator 153, 953 that is between 0.05 joules and 5 joules within an initial notification interval 162 (e.g., within a few seconds of the notable environmental field strength 274 having been encountered). As used herein, a repository is "remote" if at least some of it resides more than 1 kilometer from a corresponding wearable article 250 as described herein.

Operation 1355 describes obtaining an indication at a second environmental field detector that the one or more electric field sensors have encountered a hazardous environmental field strength (e.g., one or more interface modules 234 receiving or generating a digital indication 276 that the first electric field sensor 303 of the one or more wearable articles 250 adjacent a wearer 140, 540 has encountered a dangerously high environmental field strength 274). This can occur, for example, in a context in which the one or more electric field sensors 303 include the "first" electric field sensor, in which another (instance of an) indication 276 is correlated with the field strength 274 and is calibrated for a comparison with one or more other thresholds 277, in which an effective limit 273 thereof is significantly higher (e.g., by more than 10%), and in which one or more such Boolean indications are manifested as a voltage configuration 284 on an electrical node set 244. Alternatively, or additionally, in some variants a series of several limits 273 are implemented such that a threshold 277 implements a high-level effective limit 273 that is within an order of magnitude of 500 volts per meter.

Operation 1365 describes transmitting a danger notification to the remote entity and energizing the haptic actuator again both as an automatic and conditional real-time response to the indication that the one or more electric field sensors have encountered the hazardous environmental field strength (e.g., one or more response modules 237 contemporaneously or otherwise transmitting first and second crisis notifications 278 as a conditional composite real-time response 279 to the first electric field sensor 303 being exposed to a higher environmental field strength 274 in danger zone 521, wherein the first crisis notification is performed by energizing the first haptic actuator 153, 953 again, wherein the second crisis notification is performed by transmitting a crisis message 267 to the remote data repository 218, and wherein the hazardous environmental field strength exceeds a moderate limit 273 that corresponds to a second injury prevention threshold 277 and to Y>X joules of haptic pulse energy 161 within a corresponding notification interval 162). This can occur, for example, in a context in which the higher environmental field strength 274 is strong enough to cause one or more other thresholds 277 to be crossed (e.g., effectively determining a boundary 522 between a moderate electric field and a strong electric field), in which such crisis notifications 278 constitute a real-time (direct or other) response 279 to the first electric field sensor 303 obtaining a measurement of the higher environmental field strength 274, in which the weakest field strength 274 that would trigger such crisis notifications 278 is within 1-2 orders of magnitude of 500 volts per meter, in which at least one such crisis notification 278 implements a "second" injury prevention threshold 277 manifested as a voltage configuration 287 on an electrical node set 247 of the response module(s) 237, in which the corresponding haptic pulse energy 161 is noticeably different than that of the notable electric field strength 274 (e.g., by providing a greater haptic pulse energy 161 within a corresponding notification interval 162 starting when the indication 276 at a third environmental field detector 552 is obtained), and in which the high limit 273 is more than 105% of the moderate limit 273.

All of the patents and other publications referred to above are incorporated herein by reference generally—including those identified in relation to particular new applications of existing techniques—to the extent not inconsistent herewith. While various system, method, article of manufacture, or other embodiments or aspects have been disclosed above, also, other combinations of embodiments or aspects will be apparent to those skilled in the art in view of the above disclosure. The various embodiments and aspects disclosed above are for purposes of illustration and are not intended to be limiting, with the true scope and spirit being indicated in the final claim set that follows.

In the numbered clauses below, specific combinations of aspects and embodiments are articulated in a shorthand form such that (1) according to respective embodiments, for each instance in which a "component" or other such identifiers appear to be introduced (with "a" or "an," e.g.) more than once in a given chain of clauses, such designations may either identify the same entity or distinct entities; and (2) what might be called "dependent" clauses below may or may not incorporate, in respective embodiments, the features of "independent" clauses to which they refer or other features described above.

With respect to the numbered claims expressed below, those skilled in the art will appreciate that recited operations therein may generally be performed in any order. Also, although various operational flows are presented in sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

CLAUSES

1. A field-detecting safety system 100, 200, 400 comprising:

transistor-based circuitry (e.g., one or more interface modules 233) configured to obtain an indication 276 at a first environmental field detector 552 of a first environmental field strength 274 being large enough to cross a first injury prevention threshold 277 at one or more (bands or other tethers 294, hats 296, jackets 297, gloves 299) or other wearable articles 250; and transistor-based circuitry (e.g., one or more response modules 236) configured to transmit a first warning notification 278 by selectively energizing the first haptic actuator 153, 953 of the one or more wearable articles 250 as an automatic and conditional response 279 to the first environmental field strength 274 exceeding the first injury prevention threshold 277.

2. The system of System Clause 1, wherein the first environmental field detector 552 is associated with the first haptic actuator 153, 953.

3. The system of System Clause 1 or 2, wherein transistor-based circuitry recited therein is implemented on a single application-specific integrated circuit (ASIC).

4. The system of System Clause 1 or 2, wherein the transistor-based circuitry recited therein is distributed across two or more mutually remote facilities.

5. The system of ANY of the above System Clauses, comprising:

transistor-based circuitry (e.g., an instance of interface module 231) configured to prompt a structured interaction (e.g., a tutorial, startup sequence, or other dialog 977) by which a (diagnostic or other particular) reference electric field 157 is encountered at a first (instance of an) electric field sensor 303 of one or more wearable articles 250 that include a first (instance of a) haptic actuator 153, 953 of the one or more wearable articles 250.

6. The system of ANY of the above System Clauses, comprising:

transistor-based circuitry (e.g., an instance of interface module 231) configured to initiate, prompt, or otherwise signal a structured interaction by which a reference electric field 157 is encountered at a first electric field sensor 303 of one or more wearable articles 250 that include a first haptic actuator 153, 953 wired (directly or otherwise) to a first (instance of a) modem 293 of the one or more wearable articles 250.

7. The system of ANY of the above System Clauses wherein the one or more wearable articles 250 includes a first (instance of a) modem 293.

8. The system of ANY of the above System Clauses, comprising the one or more wearable articles 250.

9. The system of ANY of the above System Clauses, comprising the first haptic actuator 153, 953.

10. The system of ANY of the above System Clauses wherein the first haptic actuator 153 is part of a first wearable article 250 of the one or more wearable articles, and wherein the first wearable article is configured to be worn on a first limb of a human user.

11. The system of ANY of the above System Clauses wherein the first haptic actuator is part of a first wearable article of the one or more wearable articles, wherein the first wearable article is configured to be worn on a first limb of a human user, comprising:

transistor-based circuitry configured to obtain a second indication at a second environmental field detector 552 of a second environmental field strength 274 being large enough to cross one or more injury prevention thresholds 277 at a second (instance of a) wearable article of the one or more wearable articles 250, wherein a second environmental field detector 552 is associated with a second (instance of a) haptic actuator 153 that is part of the second wearable article.

12. The system of ANY of the above System Clauses wherein the first haptic actuator is part of a first wearable article of the one or more wearable articles, wherein the first wearable article is configured to be worn on a first limb of a human user, comprising:

transistor-based circuitry configured to obtain a second indication at a second environmental field detector 552 of a second environmental field strength 274 being large enough to cross one or more injury prevention thresholds 277 at a second wearable article of the one or more wearable articles 250, wherein a second environmental field detector 552 is associated with a second haptic actuator that is part of the second wearable article; and transistor-based circuitry (e.g., one or more response modules 236) configured to transmit a second warning notification 278 by energizing the second haptic actuator 153, 953 of the second article of the one or more wearable articles 250 as a second automatic and conditional response 279.

13. The system of ANY of the above System Clauses, comprising:

transistor-based circuitry (e.g., interface module 232) configured to transmit first and second (diagnostic, startup, or other) reference notifications 278, wherein the first (instance of a) reference notification 278 is performed by energizing (an instance of) a haptic actuator 153, 953 of the one or more wearable articles 250 adjacent a user and wherein the second reference notification 278 is performed by indicating the energizing via a local user interface 154 (e.g., on or near one or more wearable articles 250);

14. The system of ANY of the above System Clauses wherein the first injury prevention threshold 277 corresponds to X joules of mechanical pulse energy 161 expended haptically via the first haptic actuator 153, 953 within an interval 162 of less than five seconds (e.g., starting upon a sensor of the one or more wearable articles encountering the first environmental field strength 274) as the first danger notification 278 and wherein 0.005<X<50.

15. The system of ANY of the above System Clauses wherein the first injury prevention threshold 277 corresponds to X joules of mechanical pulse energy 161 expended within an interval of less than five seconds (e.g., starting upon a sensor of the one or more wearable articles encountering the first environmental field strength 274) as the first danger notification 278 and wherein 0.01<X<1.

16. The system of ANY of the above System Clauses wherein the first injury prevention threshold 277 corresponds to X joules of mechanical pulse energy 161 expended within an interval of less than five seconds (e.g., starting upon a sensor of the one or more wearable articles encountering the first environmental field strength 274) as the first danger notification 278 and wherein 0.5<X<50.

17. The system of ANY of the above System Clauses wherein the first injury prevention threshold 277 bounds or otherwise corresponds to a first environmental field strength 274 (e.g., at a boundary 524 of a buffer zone 523) that is within 1-2 orders of magnitude of 5 to 50 volts per meter and (also corresponds) to X joules of mechanical pulse energy 161 expended within an interval of less than five seconds as the first danger notification 278 and wherein 0.005<X<50.

18. The system of ANY of the above System Clauses wherein the first injury prevention threshold 277 bounds or otherwise corresponds to a first environmental field strength 274 (e.g., at a boundary 524 of a buffer zone 523) that is within 1-2 orders of magnitude of 500 to 5000 volts per meter and also corresponds to X joules of mechanical pulse energy 161 expended within an interval of less than five seconds as the first danger notification 278 and wherein 0.005<X<50.

19. The system of ANY of the above System Clauses wherein the second injury prevention threshold 277 (bounds or otherwise) corresponds to a hazardous second environmental field strength 274 (e.g., at a boundary 522 of a danger zone 521) that is more than 105% of the first environmental field strength 274.

20. The system of ANY of the above System Clauses wherein the second injury prevention threshold 277 corresponds to a hazardous second environmental field strength 274 (e.g., at a boundary 522 of a danger zone 521) that is more than 125% of the first environmental field strength 274.

21. The system of ANY of the above System Clauses wherein the second injury prevention threshold 277 corresponds to a hazardous second environmental field strength 274 (e.g., at a boundary 522 of a danger zone 521) that is more than double the first environmental field strength 274.

22. The system of ANY of the above System Clauses wherein the second injury prevention threshold 277 bounds or otherwise corresponds to a hazardous second environmental field strength 274 (e.g., at a boundary 522 of a danger zone 521) that is more than 105% of the first environmental field strength 274 and to Y>X joules of mechanical pulse energy 161 within less than five seconds.

23. The system of ANY of the above System Clauses wherein the one or more wearable articles 250 are configured to trigger the second danger notification 278 by transmitting an alarm message 267 to the remote data repository 218 as a response 279 to one or more electric field sensors 303 detecting the hazardous second environmental field strength 274.

24. The system of ANY of the above System Clauses wherein the first injury prevention threshold 277 (bounds or otherwise) corresponds to a first environmental field strength 274 (e.g., at a boundary 524 of a buffer zone 523) that is within 2-3 orders of magnitude of 50 to 500 volts per meter and also corresponds to X joules of mechanical pulse energy 161 expended within an interval of less than five seconds as the first danger notification 278, wherein 0.005<X<50, wherein the second injury prevention threshold 277 bounds or otherwise corresponds to a hazardous second environmental field strength 274 (e.g., at a boundary 522 of a danger zone 521) that is more than 105% of the first environmental field strength 274 and to Y>X joules of mechanical pulse energy 161 within less than five seconds, and wherein the one or more wearable articles 250 are configured to trigger the second danger notification 278 by transmitting an alarm message 267 through a first modem 293 of the one or more wearable articles 250 to the remote data repository 218 as a response 279 to one or more electric field sensors 303 detecting the hazardous second environmental field strength 274.

25. The system of ANY of the above System Clauses wherein the one or more wearable articles 250 include a wireless modem 293.

26. The system of ANY of the above System Clauses wherein the one or more wearable articles 250 are operably coupled to a wireless modem 293 or include a wireless modem 293 (or both).

27. The system of System Clause 1 wherein the one or more wearable articles comprise a tether 294 configured to support one or more electric field sensors 303 and to be worn on a human limb.

28. The system of System Clause 1 wherein the one or more wearable articles comprise a tether 294 configured as a wristband and to support one or more electric field sensors 303.

29. The system of System Clause 1 wherein the one or more wearable articles comprise a hat 296 configured to support one or more electric field sensors 303.

30. The system of System Clause 1 wherein the one or more wearable articles comprise a jacket 297 configured to support one or more electric field sensors 303.

31. The system of System Clause 1 wherein the one or more wearable articles comprise a jacket 297 or other garment configured to support at least one of the one or more electric field sensors 303.

32. The system of System Clause 1 wherein the transistor-based circuitry (e.g., one or more response modules 236) configured to transmit the first warning notification 278 is also configured to transmit a second warning notification 278 to a remote data repository 218 as an automatic and conditional response 279 to the first environmental field strength 274.

33. The system of System Clause 1, comprising:
transistor-based circuitry (e.g., interface module 234) configured to obtain an indication 276 at a second environmental field detector 552 that the one or more wearable articles 250 has encountered a hazardous second environmental field strength 274 that is large enough to cause the first indication 276 to cross a second injury prevention threshold 277; and
transistor-based circuitry (e.g., response module 237) configured to transmit first and second danger notifications 278 both as an automatic and conditional response 279 to the second environmental field strength 274 exceeding the second injury prevention threshold 277, wherein the first danger notification 278 is performed by energizing the first haptic actuator 153, 953 again as an automatic and conditional real-time response 279 to the second environmental field strength 274 exceeding the second injury prevention threshold 277.

34. A field-detecting safety method (e.g., as described above with respect to FIG. 6, 9, 10, or 13) comprising:
invoking transistor-based circuitry (e.g., one or more interface modules 233) configured to obtain an indication 276 at a first environmental field detector 552 of a first environmental field strength 274 being large enough to cross a first injury prevention threshold 277 at one or more (bands or other tethers 294, hats 296, jackets 297, gloves 299 or other) wearable articles 250; and
invoking transistor-based circuitry (e.g., one or more response modules 236) configured to transmit a first warning notification 278 by energizing the first haptic actuator 153, 953 of the one or more wearable articles 250 as an automatic and conditional response 279 to the first environmental field strength 274 exceeding the first injury prevention threshold 277.

With respect to the numbered claims expressed below, those skilled in the art will appreciate that recited operations therein may generally be performed in any order. Also, although various operational flows are presented in sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. An electric-field-detecting safety system comprising:
   first transistor-based circuitry configured to prompt a structured interaction by which a reference electric field is encountered at a first electric field sensor of one or more wearable articles that include a first haptic actuator of said one or more wearable articles;
   second transistor-based circuitry configured to transmit first and second reference notifications both as an automatic and conditional response to an indication that a reference electric field strength at said first electric field sensor of said one or more wearable articles adjacent a wearer exceeds a first activation threshold, wherein said first reference notification is performed by energizing said first haptic actuator of said one or more wearable articles and wherein said second reference notification is performed by indicating said energizing of a user interface local to the wearer;
   third transistor-based circuitry configured to obtain an indication at a first environmental electric field detector that said first electric field sensor of said one or more wearable articles has encountered a first environmental electric field strength that is large enough to cause said first indication to cross a first injury prevention threshold, wherein said first environmental electric field detector is associated with said first haptic actuator of said one or more wearable articles and wherein said first injury prevention threshold corresponds to a stronger field than that of said first activation threshold;
   fourth transistor-based circuitry configured to transmit first and second warning notifications both as a conditional real-time response to said first electric field sensor being exposed to said first environmental electric field strength, wherein said first warning notification is performed by energizing said first haptic actuator again as an automatic and conditional real-time response to said first environmental electric field strength exceeding said first injury prevention threshold and wherein said second warning notification is performed by transmitting a warning message as a real-time response to said first electric field sensor detecting said first environmental electric field strength;
   fifth transistor-based circuitry configured to obtain an indication at a second environmental electric field detector that said first electric field sensor of said one or more wearable articles has encountered a hazardous second environmental electric field strength that is large enough to cause said first indication to cross a second injury prevention threshold; and
   sixth transistor-based circuitry configured to transmit first and second danger notifications both as an automatic and conditional real-time response to said first electric field sensor being exposed to said hazardous second environmental electric field strength exceeding said second injury prevention threshold, wherein said first danger notification is performed by energizing said first haptic actuator again as an automatic and conditional real-time response to said hazardous second environmental electric field strength exceeding said second injury prevention threshold, wherein said first injury prevention threshold corresponds to $X$ joules of mechanical pulse energy expended within an interval of less than five seconds of when said first environmental electric field strength is encountered as said first danger notification and wherein $0.005 < X < 50$.

2. The electric-field-detecting safety system of claim 1 wherein said first injury prevention threshold corresponds to a first environmental electric field strength that is within 2 orders of magnitude of 50 to 500 volts per meter.

3. The electric-field-detecting safety system of claim 1, including said one or more wearable articles, wherein said one or more wearable articles include a first modem, wherein said first modem of said one or more wearable articles is configured to implement said second danger notification by transmitting an alarm message therethrough as a real-time response to said first electric field sensor detecting said hazardous second environmental electric field strength, and wherein said first haptic actuator of said one or more wearable articles is wired to said first modem of said one or more wearable articles.

4. The electric-field-detecting safety system of claim 1 wherein said first injury prevention threshold corresponds to a first environmental electric field strength, wherein said second injury prevention threshold corresponds to a hazardous second environmental electric field strength that is more than 110% of said first environmental electric field strength and also corresponds to $Y>X$ joules of mechanical pulse energy within less than five seconds of when said hazardous second environmental electric field strength is encountered, and wherein $0.005<X<50$.

5. The electric-field-detecting safety system of claim 1 wherein said one or more wearable articles comprise a tether configured to support said first electric field sensor and to be worn on a human limb.

6. The electric-field-detecting safety system of claim 1 wherein said one or more wearable articles comprise a hat configured to support another electric field sensor.

7. The electric-field-detecting safety system of claim 1 wherein said one or more wearable articles comprise a garment configured to support another electric field sensor.

8. The electric-field-detecting safety system of claim 1 wherein said fourth transistor-based circuitry also transmits a warning notification to a remote data repository as an automatic and conditional response to said first environmental electric field strength.

9. An electric-field-detecting safety system, comprising:
   first transistor-based circuitry configured to obtain a first indication at a first environmental electric field detector of a first environmental electric field strength being large enough to cross a first injury prevention threshold at one or more wearable articles, wherein said first environmental electric field detector is associated with a first haptic actuator of said one or more wearable articles; and
   second transistor-based circuitry configured to transmit a first warning notification by energizing said first haptic actuator of said one or more wearable articles as a first automatic and conditional response to said first environmental electric field strength exceeding said first injury prevention threshold, wherein said first injury prevention threshold corresponds to a first environmental electric field strength that is within 2 orders of magnitude of 50 to 500 volts per meter and also corresponds to $X$ joules of mechanical pulse energy expended within an interval of less than five seconds starting when said first environmental electric field strength is encountered as a first danger notification and wherein $0.005<X<50$.

10. The electric-field-detecting safety system of claim 9 wherein said first injury prevention threshold corresponds to a first environmental electric field strength and wherein said second injury prevention threshold corresponds to a hazardous second environmental electric field strength that is more than 110% of said first environmental electric field strength and also corresponds to Y>X joules of mechanical pulse energy within less than five seconds of when said hazardous second environmental electric field strength is encountered.

11. The electric-field-detecting safety system of claim 9 including said one or more wearable articles wherein said one or more wearable articles include a first modem and wherein said first haptic actuator of said one or more wearable articles is wired to said first modem of said one or more wearable articles.

12. The electric-field-detecting safety system of claim 9 including said one or more wearable articles wherein said one or more wearable articles include a first modem and wherein said first modem of said one or more wearable articles is configured to implement said second danger notification by transmitting an alarm message therethrough as a real-time response to said first electric field sensor detecting said hazardous second environmental electric field strength.

13. The electric-field-detecting safety system of claim 9 comprising:
third transistor-based circuitry configured to prompt a structured interaction by which a reference electric field is encountered at a first electric field sensor of one or more wearable articles that include a first haptic actuator of said one or more wearable articles.

14. The electric-field-detecting safety system of claim 9 wherein said first haptic actuator is part of a first wearable article of said one or more wearable articles, and wherein said first wearable article is configured to be worn on a first limb of a human user.

15. The electric-field-detecting safety system of claim 9 wherein said first haptic actuator is part of a first wearable article of said one or more wearable articles, wherein said first wearable article is configured to be worn on a first limb of a human user, comprising:
third transistor-based circuitry configured to obtain a second indication at a second environmental field detector of a second environmental electric field strength being large enough to cross one or more injury prevention thresholds at a second wearable article of said one or more wearable articles, and wherein a second environmental field detector is associated with a second haptic actuator that is part of said second wearable article.

16. The electric-field-detecting safety system of claim 9 wherein said first haptic actuator is part of a first wearable article of said one or more wearable articles, wherein said first wearable article is configured to be worn on a first limb of a human user, comprising:
third transistor-based circuitry configured to obtain a second indication at a second environmental field detector of a second environmental electric field strength being large enough to cross one or more injury prevention thresholds at a second wearable article of said one or more wearable articles, and wherein a second environmental field detector is associated with a second haptic actuator that is part of said second wearable article; and
fourth transistor-based circuitry configured to transmit a second warning notification by energizing said second haptic actuator of said second wearable article of said one or more wearable articles as a second automatic and conditional response.

17. The electric-field-detecting safety system of claim 9 wherein said first injury prevention threshold corresponds to X joules of mechanical pulse energy expended within an interval of less than five seconds as said first danger notification and wherein $0.01<X<1$.

18. The electric-field-detecting safety system of claim 9 wherein said first injury prevention threshold corresponds to X joules of mechanical pulse energy expended within an interval of less than five seconds as said first danger notification and wherein $0.5<X<50$.

19. The electric-field-detecting safety system of claim 9 wherein said first injury prevention threshold corresponds to a first environmental electric field strength that is within 1 order of magnitude of 5 to 50 volts per meter.

20. The electric-field-detecting safety system of claim 9 wherein all of said first and second transistor-based circuitry is implemented on a single application-specific integrated circuit (ASIC) and wherein said second injury prevention threshold corresponds to a hazardous second environmental electric field strength that is more than 105% of said first environmental electric field strength.

21. The electric-field-detecting safety system of claim 9 wherein said second injury prevention threshold corresponds to a hazardous second environmental electric field strength that is more than 125% of said first environmental electric field strength.

22. The electric-field-detecting safety system of claim 9 wherein said second injury prevention threshold corresponds to a hazardous second environmental electric field strength that is more than double said first environmental electric field strength and wherein said first and second transistor-based circuitry is distributed across two or more mutually remote facilities.

23. The electric-field-detecting safety system of claim 9 wherein said second injury prevention threshold corresponds to a hazardous second environmental electric field strength that is more than 105% of said first environmental electric field strength and to Y>X joules of mechanical pulse energy within less than five seconds.

24. The electric-field-detecting safety system of claim 9 wherein said one or more wearable articles are configured to trigger a second danger notification by transmitting an alarm message to said remote data repository as a response to one or more electric field sensors detecting said hazardous second environmental electric field strength and wherein said one or more wearable articles comprise a tether configured as a wristband and to support one or more electric field sensors.

25. The electric-field-detecting safety system of claim 9 wherein said second injury prevention threshold corresponds to a hazardous second environmental electric field strength that is more than 105% of said first environmental electric field strength and to Y>X joules of mechanical pulse energy within less than five seconds and wherein said one or more wearable articles are configured to trigger a second danger notification by transmitting an alarm message through a first modem of said one or more wearable articles to said remote data repository as a response to one or more electric field sensors detecting said hazardous second environmental electric field strength.

26. The electric-field-detecting safety system of claim 9 wherein all of said first and second transistor-based circuitry is implemented on a single application-specific integrated circuit (ASIC) and wherein said one or more wearable articles comprise a tether configured to support one or more electric field sensors and to be worn on a human limb.

27. The electric-field-detecting safety system of claim 9 wherein said one or more wearable articles comprise a jacket configured to support one or more electric field sensors.

28. The electric-field-detecting safety system of claim 9 wherein said second transistor-based circuitry configured to transmit said first warning notification by energizing said first haptic actuator of said one or more wearable articles as said first automatic and conditional response to said first environmental electric field strength exceeding said first injury prevention threshold is also configured to transmit a second warning notification to a remote data repository as an automatic and conditional response to said first environmental electric field strength exceeding said first injury prevention threshold.

29. The electric-field-detecting safety system of claim 9 comprising:
   third transistor-based circuitry configured to obtain an indication at a second environmental field detector that said one or more wearable articles has encountered a hazardous second environmental electric field strength that is large enough to cause said first indication to cross a second injury prevention threshold; and
   fourth transistor-based circuitry configured to transmit first and second danger notifications both as an automatic and conditional response to said second environmental electric field strength exceeding said second injury prevention threshold, wherein said first danger notification is performed by energizing said first haptic actuator again as an automatic and conditional real-time response to said second environmental electric field strength exceeding said second injury prevention threshold and wherein said one or more wearable articles comprise a hat configured to support one or more electric field sensors.

30. An electric-field-detecting safety system, comprising:
   first transistor-based circuitry configured to obtain a first indication at a first environmental electric field detector of a first environmental electric field strength being large enough to cross a first injury prevention threshold at one or more wearable articles, wherein said first environmental electric field detector is associated with a first haptic actuator of said one or more wearable articles; and
   second transistor-based circuitry configured to transmit a first warning notification by energizing said first haptic actuator of said one or more wearable articles as a first automatic and conditional response to said first environmental electric field strength exceeding said first injury prevention threshold, wherein said first injury prevention threshold corresponds to a first environmental electric field strength that is within 2 orders of magnitude of 500 to 5000 volts per meter and also corresponds to X joules of mechanical pulse energy expended within an interval of less than five seconds as a first danger notification and wherein $0.005 < X < 50$.

31. The electric-field-detecting safety system of claim 30 wherein said second injury prevention threshold corresponds to a hazardous second environmental electric field strength that is more than 110% of said first environmental electric field strength and also corresponds to $Y > X$ joules of mechanical pulse energy within less than five seconds of when said hazardous second environmental electric field strength is encountered and wherein said first and second transistor-based circuitry is all implemented on a single application-specific integrated circuit (ASIC).

32. The electric-field-detecting safety system of claim 30 wherein said second injury prevention threshold corresponds to a hazardous second environmental electric field strength that is more than 110% of said first environmental electric field strength and also corresponds to $Y > X$ joules of mechanical pulse energy within less than five seconds of when said hazardous second environmental electric field strength is encountered and wherein said first and second transistor-based circuitry is distributed across two or more mutually remote facilities.

33. The electric-field-detecting safety system of claim 30 comprising:
   third transistor-based circuitry configured to prompt a structured interaction by which a reference electric field is encountered at a first electric field sensor of one or more wearable articles that include said first haptic actuator of said one or more wearable articles.

34. The electric-field-detecting safety system of claim 30 comprising:
   third transistor-based circuitry configured to signal a structured interaction by which a reference electric field is encountered at a first electric field sensor of one or more wearable articles that include said first haptic actuator wired to a first modem of said one or more wearable articles wherein said first haptic actuator is part of a first wearable article of said one or more wearable articles and wherein said first wearable article is configured to be worn on a first limb of a human user.

35. The electric-field-detecting safety system of claim 30 wherein said first haptic actuator is part of a first wearable article of said one or more wearable articles, wherein said first wearable article is configured to be worn on a first limb of a human user, comprising:
   third transistor-based circuitry configured to obtain a second indication at a second environmental field detector of a second environmental electric field strength being large enough to cross one or more injury prevention thresholds at a second wearable article of said one or more wearable articles, wherein a second environmental field detector is associated with a second haptic actuator that is part of said second wearable article.

36. The electric-field-detecting safety system of claim 30 wherein said first haptic actuator is part of a first wearable article of said one or more wearable articles, wherein said first wearable article is configured to be worn on a first limb of a human user, comprising:
   third transistor-based circuitry configured to obtain a second indication at a second environmental field detector of a second environmental electric field strength being large enough to cross one or more injury prevention thresholds at a second wearable article of said one or more wearable articles, wherein a second environmental field detector is associated with a second haptic actuator that is part of said second wearable article.

37. The electric-field-detecting safety system of claim 30 wherein said first injury prevention threshold corresponds to X joules of mechanical pulse energy expended within an interval of less than five seconds as said first danger notification and wherein $0.01 < X < 1$.

38. The electric-field-detecting safety system of claim 30 wherein said first injury prevention threshold corresponds to X joules of mechanical pulse energy expended within an interval of less than five seconds as said first danger notification and wherein $0.5 < X < 50$.

39. The electric-field-detecting safety system of claim 30 wherein said first injury prevention threshold corresponds to a first environmental electric field strength that is within 1 order of magnitude of 500 to 5000 volts per meter and wherein a first wearable article of said one or more wearable articles includes said first haptic actuator and is configured to be worn on a first limb of a human user.

40. The electric-field-detecting safety system of claim 30 wherein said second injury prevention threshold corresponds to a hazardous second environmental electric field strength that is more than 105% of said first environmental electric field strength.

41. The electric-field-detecting safety system of claim 30 wherein said second injury prevention threshold corresponds to a hazardous second environmental electric field strength that is more than 125% of said first environmental electric field strength.

42. The electric-field-detecting safety system of claim 30 wherein said second injury prevention threshold corresponds to a hazardous second environmental electric field strength that is more than double of said first environmental electric field strength.

43. The electric-field-detecting safety system of claim 30 wherein said one or more wearable articles are configured to trigger a second danger notification by transmitting an alarm message to said remote data repository as a response to one or more electric field sensors detecting a hazardous second environmental electric field strength.

44. The electric-field-detecting safety system of claim 30 wherein said first injury prevention threshold corresponds to a first environmental electric field strength that is within 3 orders of magnitude of 50 to 500 volts per meter and also corresponds to X joules of mechanical pulse energy expended within an interval of less than five seconds as said first danger notification, wherein said second injury prevention threshold corresponds to a hazardous second environmental electric field strength that is more than 105% of said first environmental electric field strength and to Y>X joules of mechanical pulse energy within less than five seconds, and wherein said one or more wearable articles are configured to trigger said second danger notification by transmitting an alarm message through a first modem of said one or more wearable articles to said remote data repository as a response to one or more electric field sensors detecting said hazardous second environmental electric field strength.

45. The electric-field-detecting safety system of claim 30 wherein said one or more wearable articles comprise a tether configured to support one or more electric field sensors and to be worn on a human limb.

46. The electric-field-detecting safety system of claim 30 wherein said one or more wearable articles comprise a tether configured as a wristband and to support one or more electric field sensors.

47. The electric-field-detecting safety system of claim 30 wherein said one or more wearable articles comprise a garment configured to support at least one of said one or more electric field sensors.

48. The electric-field-detecting safety system of claim 30 wherein said second transistor-based circuitry configured to transmit said first warning notification is also configured to transmit a second warning notification to a remote data repository as an automatic and conditional response to said first environmental electric field strength.

49. The electric-field-detecting safety system of claim 30 comprising:
  third transistor-based circuitry configured to obtain an indication at a second environmental field detector that said one or more wearable articles has encountered a hazardous second environmental electric field strength that is large enough to cause said first indication to cross a second injury prevention threshold; and
  fourth transistor-based circuitry configured to transmit first and second danger notifications both as an automatic and conditional response to said second environmental electric field strength exceeding said second injury prevention threshold, wherein said first danger notification is performed by energizing said first haptic actuator again as an automatic and conditional real-time response to said second environmental electric field strength exceeding said second injury prevention threshold.

50. An electric-field-detecting safety system, comprising:
  first transistor-based circuitry configured to obtain a first indication at a first environmental electric field detector of a first environmental electric field strength being large enough to cross a first injury prevention threshold that corresponds to X joules of mechanical pulse energy expended within an interval of less than five seconds at one or more wearable articles, wherein said first environmental electric field detector is associated with a first haptic actuator of said one or more wearable articles;
  second transistor-based circuitry configured to transmit a first warning notification by energizing said first haptic actuator of said one or more wearable articles as a first automatic and conditional response to said first environmental electric field strength exceeding said first injury prevention threshold;
  third transistor-based circuitry configured to obtain an indication at a second environmental electric field detector that said first electric field sensor of said one or more wearable articles has encountered a second environmental electric field strength that is large enough to cause said first indication to cross a second injury prevention threshold, wherein said second injury prevention threshold corresponds to a second environmental electric field strength that is more than 105% of said first environmental electric field strength and to Y>X joules of mechanical pulse energy within less than five seconds.

51. The electric-field-detecting safety system of claim 50 wherein said first injury prevention threshold corresponds to a first environmental electric field strength that is within 2 orders of magnitude of 50 to 500 volts per meter and also corresponds to X joules of mechanical pulse energy expended within an interval of less than five seconds of when said first environmental electric field strength is detected as said first danger notification and wherein 0.005<X<50.

52. The electric-field-detecting safety system of claim 50 wherein said first injury prevention threshold corresponds to a first environmental electric field strength wherein said second injury prevention threshold corresponds to a hazardous second environmental electric field strength that is more than 110% of said first environmental electric field strength.

53. The electric-field-detecting safety system of claim 50 wherein transistor-based circuitry is implemented on a single application-specific integrated circuit (ASIC).

54. The electric-field-detecting safety system of claim 50 wherein said system is distributed across two or more mutually remote facilities.

55. The electric-field-detecting safety system of claim 50 comprising: transistor-based circuitry configured to prompt a structured interaction by which a reference electric field is encountered at a first electric field sensor of one or more wearable articles that include said first haptic actuator of said one or more wearable articles.

56. The electric-field-detecting safety system of claim 50 comprising: transistor-based circuitry configured to signal a structured interaction by which a reference electric field is encountered at a first electric field sensor of one or more wearable articles that include said first haptic actuator wired to a first modem of said one or more wearable articles.

57. The electric-field-detecting safety system of claim 50 wherein said first haptic actuator is part of a first wearable article of said one or more wearable articles, and wherein said first wearable article is configured to be worn on a first limb of a human user.

58. The electric-field-detecting safety system of claim 50 wherein said first haptic actuator is part of a first wearable article of said one or more wearable articles, wherein said first wearable article is configured to be worn on a first limb of a human user, comprising: transistor-based circuitry configured to obtain a second indication at a second environmental field detector of a second environmental electric field strength being large enough to cross one or more injury prevention thresholds at a second wearable article of said one or more wearable articles, wherein a second environmental field detector is associated with a second haptic actuator that is part of said second wearable article.

59. The electric-field-detecting safety system of claim 50 wherein said first haptic actuator is part of a first wearable article of said one or more wearable articles, wherein said first wearable article is configured to be worn on a first limb of a human user, comprising: transistor-based circuitry configured to obtain a second indication at a second environmental field detector of a second environmental electric field strength being large enough to cross one or more injury prevention thresholds at a second wearable article of said one or more wearable articles, wherein a second environmental field detector is associated with a second haptic actuator that is part of said second wearable article; and transistor-based circuitry configured to transmit a second warning notification by energizing said second haptic actuator of said second wearable article of said one or more wearable articles as a second automatic and conditional response.

60. The electric-field-detecting safety system of claim 50 wherein said first injury prevention threshold corresponds to X joules of mechanical pulse energy expended within an interval of less than five seconds as said first danger notification and wherein $0.01<X<1$.

61. The electric-field-detecting safety system of claim 50 wherein said first injury prevention threshold corresponds to X joules of mechanical pulse energy expended within an interval of less than five seconds as said first danger notification and wherein $0.5<X<50$.

62. The electric-field-detecting safety system of claim 50 wherein said first injury prevention threshold corresponds to a first environmental electric field strength that is within 1 order of magnitude of 5 to 50 volts per meter and to X joules of mechanical pulse energy expended within an interval of less than five seconds as said first danger notification and wherein $0.005<X<50$.

63. The electric-field-detecting safety system of claim 50 wherein said first injury prevention threshold corresponds to a first environmental electric field strength that is within 2 orders of magnitude of 500 to 5000 volts per meter and also corresponds to X joules of mechanical pulse energy expended within an interval of less than five seconds as said first danger notification and wherein $0.005<X<50$.

64. The electric-field-detecting safety system of claim 50 wherein said second injury prevention threshold corresponds to a hazardous second environmental electric field strength that is more than 105% of said first environmental electric field strength.

65. The electric-field-detecting safety system of claim 50 wherein said second injury prevention threshold corresponds to a hazardous second environmental electric field strength that is more than 125% of said first environmental electric field strength.

66. The electric-field-detecting safety system of claim 50 wherein said second injury prevention threshold corresponds to a hazardous second environmental electric field strength that is more than double said first environmental electric field strength.

67. The electric-field-detecting safety system of claim 50 wherein said second injury prevention threshold corresponds to a hazardous second environmental electric field strength that is more than 105% of said first environmental electric field strength and to Y>X joules of mechanical pulse energy within less than five seconds.

68. The electric-field-detecting safety system of claim 50 wherein said one or more wearable articles are configured to trigger said second danger notification by transmitting an alarm message to said remote data repository as a response to one or more electric field sensors detecting said hazardous second environmental electric field strength.

69. The electric-field-detecting safety system of claim 50 wherein said first injury prevention threshold corresponds to a first environmental electric field strength that is within 3 orders of magnitude of 50 to 500 volts per meter and also corresponds to X joules of mechanical pulse energy expended within an interval of less than five seconds as said first danger notification, wherein $0.005<X<50$, wherein said second injury prevention threshold corresponds to a hazardous second environmental electric field strength that is more than 105% of said first environmental electric field strength and to Y>X joules of mechanical pulse energy within less than five seconds, and wherein said one or more wearable articles are configured to trigger a second danger notification by transmitting an alarm message through a first modem of said one or more wearable articles to said remote data repository as a response to one or more electric field sensors detecting said hazardous second environmental electric field strength.

70. The electric-field-detecting safety system of claim 50 wherein said one or more wearable articles comprise a tether configured to support one or more electric field sensors and to be worn on a human limb.

71. The electric-field-detecting safety system of claim 50 wherein said one or more wearable articles comprise a tether configured as a wristband and to support one or more electric field sensors.

72. The electric-field-detecting safety system of claim 50 wherein said one or more wearable articles comprise a hat configured to support one or more electric field sensors.

73. The electric-field-detecting safety system of claim 50 wherein said one or more wearable articles comprise a jacket configured to support one or more electric field sensors.

74. The electric-field-detecting safety system of claim 50 wherein said one or more wearable articles comprise a garment configured to support at least one of said one or more electric field sensors.

75. The electric-field-detecting safety system of claim 50 wherein said second transistor-based circuitry configured to transmit said first warning notification is also configured to transmit a second warning notification to a remote data repository as an automatic and conditional response to said first environmental electric field strength.

76. The electric-field-detecting safety system of claim 50 comprising:

transistor-based circuitry configured to obtain an indication at a second environmental field detector that said one or more wearable articles has encountered a hazardous second environmental electric field strength that is large enough to cause said first indication to cross a second injury prevention threshold; and transistor-based circuitry configured to transmit first and second danger notifications both as an automatic and conditional response to said second environmental electric field strength exceeding said second injury prevention threshold, wherein said first danger notification is performed by energizing said first haptic actuator again as an automatic and conditional real-time response to said second environmental electric field strength exceeding said second injury prevention threshold.

77. An electric-field-detecting safety method, comprising:

invoking first transistor-based circuitry configured to obtain a first indication at a first environmental electric field detector of a first environmental electric field strength being large enough to cross a first injury prevention threshold at one or more wearable articles, wherein said first environmental electric field detector is associated with a first haptic actuator of said one or more wearable articles; and invoking second transistor-based circuitry configured to transmit a first warning notification by energizing said first haptic actuator of said one or more wearable articles as a first automatic and conditional response to said first environmental electric field strength exceeding said first injury prevention threshold, wherein said first injury prevention threshold corresponds to a first environmental electric field strength that is within 2 orders of magnitude of 50 to 500 volts per meter and also corresponds to X joules of mechanical pulse energy expended within an interval of less than five seconds starting when said first environmental electric field strength is encountered as a first danger notification and wherein $0.005 < X < 50$.

78. The electric-field-detecting safety method of claim 77 comprising:

configuring at least one of said one or more wearable articles as a garment and to support one or more electric field sensors.

79. The electric-field-detecting safety method of claim 77 comprising:

configuring a first wearable article of said one or more wearable articles as a tether configured as a wristband and to support one or more electric field sensors.

80. An electric-field-detecting safety method, comprising:

invoking first transistor-based circuitry configured to obtain a first indication at a first environmental electric field detector of a first environmental electric field strength being large enough to cross a first injury prevention threshold at one or more wearable articles, wherein said first environmental electric field detector is associated with a first haptic actuator of said one or more wearable articles; and invoking second transistor-based circuitry configured to transmit a first warning notification by energizing said first haptic actuator of said one or more wearable articles as a first automatic and conditional response to said first environmental electric field strength exceeding said first injury prevention threshold, wherein said first injury prevention threshold corresponds to a first environmental electric field strength that is within 2 orders of magnitude of 500 to 5000 volts per meter and also corresponds to X joules of mechanical pulse energy expended within an interval of less than five seconds as a first danger notification and wherein $0.005 < X < 50$.

81. The electric-field-detecting safety method of claim 80 comprising:

configuring said one or more wearable articles to include a wristband or hat that supports one or more electric field sensors of said first environmental electric field detector.

82. The electric-field-detecting safety method of claim 80 comprising:

configuring said one or more wearable articles to include a jacket or hat that supports one or more electric field sensors of said first environmental electric field detector.

83. The electric-field-detecting safety method of claim 80 comprising:

configuring said first haptic actuator as part of a first wearable article of said one or more wearable articles, wherein said first wearable article is configured to be worn on a first limb of a human user.

84. An electric-field-detecting safety method, comprising:

invoking first transistor-based circuitry configured to obtain a first indication at a first environmental electric field detector of a first environmental electric field strength being large enough to cross a first injury prevention threshold at one or more wearable articles, wherein said first environmental electric field detector is associated with a first haptic actuator of said one or more wearable articles; and invoking second transistor-based circuitry configured to transmit a first warning notification by energizing said first haptic actuator of said one or more wearable articles as a first automatic and conditional response to said first environmental electric field strength exceeding said first injury prevention threshold invoking third transistor-based circuitry configured to obtain a first indication at a second environmental electric field detector that said first electric field sensor of said one or more wearable articles has encountered a second environmental electric field strength that is large enough to cause said first indication to cross a second injury prevention threshold, wherein said second injury prevention threshold corresponds to a second environmental electric field strength that is more than 105% of said first environmental electric field strength and to $Y > X$ joules of mechanical pulse energy within less than five seconds.

85. The electric-field-detecting safety method of claim 84 comprising:

configuring a first wearable article of said one or more wearable articles to be worn on a first limb of a human user and to include said first haptic actuator.

86. The electric-field-detecting safety method of claim 84, wherein said one or more wearable articles include first and second wearable articles, said method comprising:

configuring said first wearable article to be worn on a first limb of a human user and to include said first haptic actuator; and configuring said second wearable article to include fourth transistor-based circuitry that obtains an indication at an environmental field detector of a second environmental electric field strength being large enough to cross one or more injury prevention thresholds, wherein said environmental field detector is associated with a haptic actuator that is part of said second wearable article.

87. The electric-field-detecting safety method of claim 84, wherein said one or more wearable articles include first and second wearable articles, comprising:
  invoking fourth transistor-based circuitry configured to obtain a second indication at a second environmental field detector of a second environmental electric field strength being large enough to cross one or more injury prevention thresholds at said second wearable article, wherein a second environmental field detector is associated with a second haptic actuator that is part of said second wearable article; and
  invoking transistor-based circuitry configured to transmit a second warning notification by energizing said second haptic actuator of said second wearable article of said one or more wearable articles as a second automatic and conditional response.

88. The electric-field-detecting safety method of claim 84 comprising:
  configuring said one or more wearable articles to include a tether that is configured to support said first electric field sensor and to be worn on a human limb.

* * * * *